United States Patent
Piccardi et al.

(10) Patent No.: US 9,640,239 B2
(45) Date of Patent: *May 2, 2017

(54) SENSE CIRCUITS, SEMICONDUCTOR DEVICES, AND RELATED METHODS FOR RESISTANCE VARIABLE MEMORY

(71) Applicant: Micron Technology, Inc., Boise, ID (US)

(72) Inventors: Michele Piccardi, Santa Clara, CA (US); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/258,204

(22) Filed: Sep. 7, 2016

(65) Prior Publication Data

US 2017/0040045 A1 Feb. 9, 2017

Related U.S. Application Data

(63) Continuation of application No. 14/816,344, filed on Aug. 3, 2015, now Pat. No. 9,449,687.

(51) Int. Cl.
G11C 11/00 (2006.01)
G11C 11/16 (2006.01)

(52) U.S. Cl.
CPC ........ G11C 11/1673 (2013.01); G11C 11/161 (2013.01)

(58) Field of Classification Search
CPC ..... G11C 11/16; G11C 11/15; G11C 11/4091; G11C 11/5614; G11C 11/419; G11C 11/5642

(Continued)

(56) References Cited

U.S. PATENT DOCUMENTS 8,107,280 B2 1/2012 Yoon et al.
8,259,525 B2 9/2012 Lowrey et al.
(Continued)

FOREIGN PATENT DOCUMENTS

EP 2073285 A2 6/2009

OTHER PUBLICATIONS

Bedeschi et al., A Multi-Level-Cell Bipolar-Selected Phase-Change Memory, ISSCC 2008, Session 23, Non-Volatile Memory, 23.5, 2008 IEEE International Solid-State Circuits Conference, pp. 427-429, (2008).

(Continued)

*Primary Examiner* — Huan Hoang
(74) *Attorney, Agent, or Firm* — TraskBritt

(57) ABSTRACT

Sense circuits, memory devices, and related methods are disclosed. A sense circuit includes sample and hold circuitry configured to sample and hold a second response voltage potential, a first response voltage potential, and a third response voltage potential responsive to an evaluation signal applied to a resistance variable memory cell. The sense circuit includes an amplifier operably coupled to the sample and hold circuitry. The amplifier is configured to amplify a difference between a sum of the first response voltage potential and the third response voltage potential, and twice the second response voltage potential. A memory device includes an evaluation signal generating circuit configured to provide the evaluation signal, an array of resistance variable memory cells, and the sense circuit. A method includes applying the evaluation signal to the resistance variable memory cell, sampling and holding the response voltage potentials, and discharging the sample and hold circuitry to the amplifier.

20 Claims, 9 Drawing Sheets

(58) Field of Classification Search
USPC .................................................. 365/158, 205
See application file for complete search history.

(56) References Cited

U.S. PATENT DOCUMENTS

| | | | |
|---|---|---|---|
| 8,300,454 | B2 | 10/2012 | Kramer et al. |
| 8,310,868 | B2 | 11/2012 | Kramer et al. |
| 8,320,167 | B2 | 11/2012 | Rao et al. |
| 8,358,531 | B2 | 1/2013 | Liu et al. |
| 8,358,534 | B2 | 1/2013 | Kramer et al. |
| 8,467,237 | B2 | 6/2013 | Bedeschi et al. |
| 8,472,240 | B2 | 6/2013 | Liu et al. |
| 8,472,244 | B2 | 6/2013 | Kramer et al. |
| 8,503,227 | B2 | 8/2013 | Liu et al. |
| 8,510,628 | B2 | 8/2013 | Bedeschi et al. |
| 8,525,709 | B2 | 9/2013 | Venkatraman et al. |
| 8,546,778 | B2 | 10/2013 | Zanderigo et al. |
| 8,553,449 | B2 | 10/2013 | Liu et al. |
| 8,553,451 | B2 | 10/2013 | Liu |
| 9,019,754 | B1 | 4/2015 | Bedeschi |
| 9,064,590 | B2 * | 6/2015 | Ueda .................... G11C 11/1673 |
| 9,449,687 | B1 * | 9/2016 | Piccardi ............... G11C 13/004 |
| 2005/0195647 | A1 | 9/2005 | Perner |
| 2008/0219044 | A1 | 9/2008 | Yoon et al. |
| 2009/0103354 | A1 | 4/2009 | Yoon |
| 2011/0273926 | A1 | 11/2011 | Wu et al. |
| 2012/0275218 | A1 | 11/2012 | Liu et al. |
| 2012/0287698 | A1 | 11/2012 | Lowrey et al. |
| 2012/0294077 | A1 | 11/2012 | Liu et al. |
| 2013/0001501 | A1 | 1/2013 | Sills |
| 2013/0064011 | A1 | 3/2013 | Liu et al. |
| 2013/0126997 | A1 | 5/2013 | Liu et al. |
| 2013/0128657 | A1 | 5/2013 | Alam et al. |
| 2013/0140615 | A1 | 6/2013 | Kramer et al. |
| 2013/0175644 | A1 | 7/2013 | Horng et al. |
| 2013/0181183 | A1 | 7/2013 | Pellizzer et al. |
| 2014/0177335 | A1 | 6/2014 | Xu |
| 2015/0187416 | A1 | 7/2015 | Bedeschi |

OTHER PUBLICATIONS

Kund et al., Conductive Bridging RAM (CBRAM): An Emerging Non-Volatile Memory Technology Scalable to Sub 20nm, IEEE EIDM Tech. Dig. pp. 754-757, (2005).

* cited by examiner

SENSE CIRCUITS, SEMICONDUCTOR DEVICES, AND RELATED METHODS FOR RESISTANCE VARIABLE MEMORY

CROSS-REFERENCE TO RELATED APPLICATIONS

This application is a continuation of U.S. patent application Ser. No. 14/816,344, filed Aug. 3, 2015, now U.S. Pat. No. 9,449,687, issued Sep. 20, 2016, the disclosure of which is hereby incorporated herein in its entirety by this reference. This application is related to U.S. patent application Ser. No. 14/656,908 to Bedeschi, filed Mar. 13, 2015, now U.S. Pat. No. 9,478,282, issued Oct. 25, 2016, which is a continuation of U.S. patent application Ser. No. 14/109,329, filed Dec. 17, 2013, now U.S. Pat. No. 9,019,754, issued Apr. 28, 2015, the disclosure of each of which is hereby incorporated herein in its entirety by this reference.

FIELD

The present disclosure relates generally to sensing circuits, memory devices, and related methods. More specifically, the present disclosure relates to sensing data states of resistance variable memory cells, and to related circuits, devices, systems and methods.

BACKGROUND

Memory devices are typically provided as internal, semiconductor, integrated circuits and/or external removable devices in computers or other electronic devices. There are many different types of memory including Random Access Memory (RAM), Read-Only Memory (ROM), Dynamic Random Access Memory (DRAM), Synchronous DRAM (SDRAM), Flash memory, and resistance variable memory, among others. Types of resistance variable memory include memories such as programmable conductor memory, Phase Change Random Access Memory (PCRAM), Resistive Random Access Memory (RRAM), Magnetoresistive Random Access Memory (MRAM; also referred to as magnetic random access memory), Conductive-Bridging Random Access Memory (CBRAM), and Spin Torque Transfer Random Access Memory (STT-RAM), among others.

Non-volatile memory may be used in, for example, personal computers, portable memory sticks, solid state drives (SSDs), personal digital assistants (PDAs), tablets, digital cameras, cellular telephones, portable music players (e.g., MP3 players), and movie players, among other electronic devices. Some types of data, such as program code, user data, and system data, such as a basic input/output system (BIOS), are typically stored in non-volatile memory devices.

Resistance variable memory, such as RRAM or STT-RAM, includes resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying a programming signal to the resistance variable memory cells. Programming signals can include applying sources of energy (e.g., an electrical field or magnetic field), such as by applying positive or negative electrical signals (e.g., positive or negative voltage or current signals) to the memory cells for a particular duration. Moreover, these applied signals may have particular shapes, such as pulses, ramps, sinusoids, and other suitable shapes.

A resistance variable memory cell can be programmed to one of a number of data states. For example, a single level cell (SLC) may be programmed to one of two data states, a low resistance state that corresponds to a set data state (e.g., logic 1), or a high resistance state that corresponds to a reset data state (e.g., logic 0). The data state of the memory cell can depend on whether the cell is programmed to a resistance above or below a particular level. As an additional example, various resistance variable memory cells can be programmed to one of multiple different data states corresponding to different resistance levels. Such cells may be referred to as multi-state cells, multi-digit cells, or multi-level cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistance variable memory cell may incorrectly determine the data state of the resistance variable memory cell. A memory cell can be sensed by comparing an electrical parameter of the memory cell to an electrical parameter of another memory cell or combination of memory cells that are reference memory cell(s). For example, the current flowing into the memory cell in some defined bias condition may be compared to the current flowing into a reference memory cell in the same bias conditions. The memory cell is then declared to be in a specific logic state depending on whether the current in the memory cell is greater than or less than the current in the reference memory cell. This sensing operation can be fast and simple, but may result in sensing errors. For example, a signal associated with the memory cell during a sensing operation may or may not correspond to a data state to which the memory cell was programmed, thus resulting in sensing an incorrect data state for the memory cell. Thus, improvements in detecting the data state of resistance variable memory are desired.

DETAILED DESCRIPTION

Figure 1:
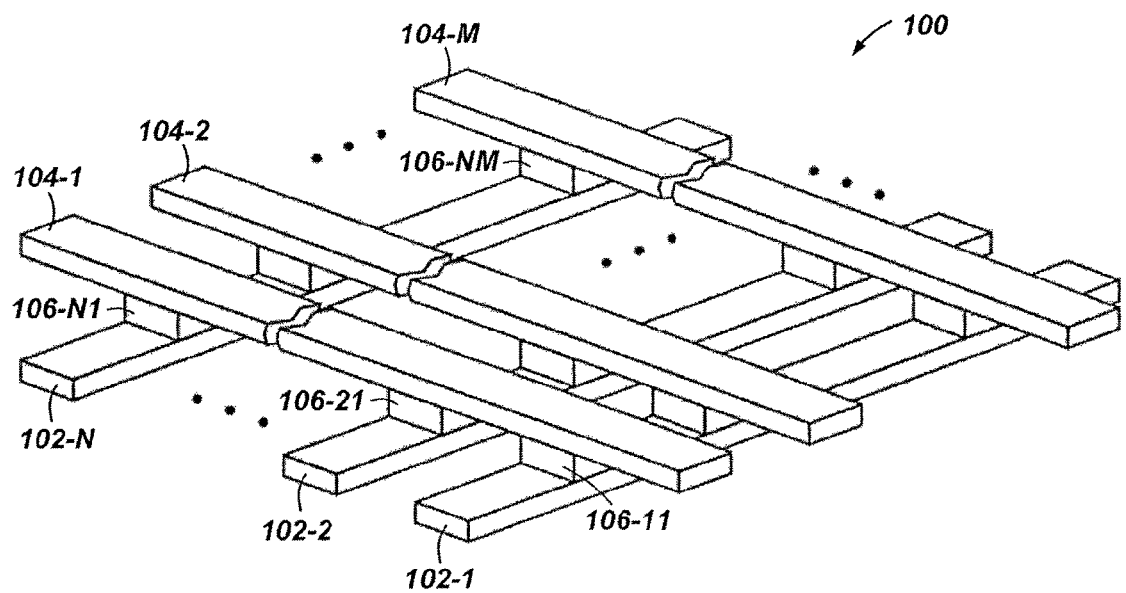
FIG. 1 is a diagram of a portion of an array of resistance variable memory cells according to embodiments of the present disclosure.

In the following detailed description, reference is made to the accompanying drawings, which form a part hereof, and in which is shown by way of illustration specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular apparatus (e.g., device, system, etc.) or method, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

The various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be rearranged. A process may correspond to a method, a function, a procedure, a subroutine, a subprogram, etc. Furthermore, the methods disclosed herein may be implemented in hardware, software, or both. If implemented in software, the functions may be stored or transmitted as one or more computer-readable instructions (e.g., software code) on a computer-readable medium. Computer-readable media may include both computer storage media and communication media including any medium that facilitates transfer of a computer program from one place to another. Computer-readable media may include volatile and non-volatile memory, such as, for example, magnetic and optical storage devices, such as, for example, hard drives, disk drives, magnetic tapes, CDs (compact discs), DVDs (digital versatile discs or digital video discs), solid state storage devices (solid state drives), and other similar storage devices.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 106) and specifically indicated by the numerical indicator followed by a numeric indicator preceded by a "dash" (e.g., 106-11), or by the numerical indicator followed by an alphabetic letter (e.g., 106A). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 5 will be mostly in the numerical format 5xx.

Sense circuits and memory devices disclosed herein may be configured to perform sense operations by sampling and holding signals corresponding to responses of a resistance variable memory cell to an evaluation signal, and amplifying arithmetic combinations of the responses. Although the present disclosure is discussed primarily with reference to STT memory, the systems and methods of the present disclosure may be implemented in any environment where sensing differences (e.g., changes) in resistance may be helpful or desirable.

The present disclosure includes apparatuses and methods for determining the state of a resistance variable memory cell by applying an evaluation signal to the memory cell, sensing responses of the memory cell, and analyzing the responses.

In this description significant detail has been presented for STT-RAM cells as one example of a resistance variable memory cell that may be used in embodiments of the present disclosure. However, embodiments are not so limited. Embodiments of the present disclosure may be used with many types of resistance variable memory cells that exhibit different resistance levels for different data states and that will switch from one resistance level to another resistance level in response to an evaluation signal for at least one of the data states.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

FIG. 1 is a diagram of a portion of an array 100 of resistance variable memory cells 106 according to embodiments of the present disclosure. In the example illustrated in FIG. 1, the array 100 is a cross-point array having resistance variable memory cells 106 located at the intersections of a first number of conductive lines 102-1, 102-2, . . . , 102-N (e.g., access lines, which may also be referred to herein as "word lines" 102), and a second number of conductive lines 104-1, 104-2, . . . , 104-M (e.g., data sense lines, which may also be referred to herein as "bit lines" 104). As illustrated in FIG. 1, the word lines 102 are substantially parallel to each other and are substantially orthogonal to the bit lines 104, which are substantially parallel to each other; however, embodiments are not so limited. In the embodiment illustrated in FIG. 1, the resistance variable memory cells 106 (e.g., 106-11, 106-21, 106-N1, and 106-NM) can function in a two-terminal architecture with a particular word line 102 and a particular bit line 104 serving as a bottom electrode and top electrode, respectively, for the resistance variable memory cell 106. Depending on the memory technology, additional lines may be present in the array (e.g., a source line), that are not shown in FIG. 1.

Each resistance variable memory cell 106 can include a storage element (e.g., a resistance variable memory element) coupled to a selection device (e.g., one or more access devices, not shown in FIG. 1). The access devices can be, for example, diodes or transistors (e.g., a field effect transistors (FET) or bipolar junction transistors (BJT)), other access devices, and combinations thereof. The storage element can include a programmable portion that may have a variable resistance, for example. The resistance variable memory cell 106 may be a Spin Torque Transfer Random Access Memory (STT-RAM) cell and include magnetic tunnel junction, for example. For instance, the storage element may include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of the resistance variable memory cells 106 can include various materials employing trapped charges to modify or alter conductivity, chalcogenides formed of various doped or undoped materials, binary metal oxide materials, colossal magnetoresistive materials, and/or various polymer-based resistance variable materials, among others. Embodiments are not limited to a particular resistance variable material or materials. As such, the resistance variable memory cells 106 can be single level and/or multilevel Resistive Random Access Memory (RRAM) cells, Spin Torque Transfer Random Access Memory (STT-RAM) cells, programmable conductor memory cells, Phase Change Random Access Memory (PCRAM) cells, Magnetoresistive Random Access Memory (MRAM) cells, and/or Conductive-Bridging Random Access Memory (CBRAM) cells, among various other types of resistance variable memory cells.

In operation, the resistance variable memory cells 106 of the array 100 may be programmed via programming signals (e.g., write voltage and/or current pulses) applied to the cells 106 (e.g., the storage element of the cells 106) via selected word lines 102, bit lines 104, other suitable signals coupled to the resistance variable memory cells 106, and combinations thereof. The amplitude, shape, duration, and/or number of programming pulses, for example, applied to the resistance variable memory cells 106 can be adjusted (e.g., varied) in order to program the cells 106 to one of a number of different resistance levels corresponding to particular data states.

In a number of embodiments, a single level resistance variable memory cell 106 may be programmed to one of two data states (e.g., logic 1 or 0). The resistance variable memory cell 106 may be programmed with a first programming signal, which will place the resistance variable memory cell 106 in a relatively lower resistance data state (e.g., logic 1) or the resistance variable memory cell 106 may be programmed with a second programming signal, which will place the resistance variable memory cell 106 in a relatively higher resistance data state (e.g., logic 0).

A sensing (e.g., read, program, verify, or evaluation) operation can be used to determine the data state of the resistance variable memory cell 106 by sensing (e.g., reading) a signal, for example, on the bit line 104 associated with the respective cell 106 responsive to a particular evaluation signal applied to the bit line 104 to which the selected cell 106 is coupled. Sensing the signal associated with the respective cell 106 may include sensing a voltage, a current (e.g., an amplitude of such), or other characteristics of the signal. In a number of embodiments, where the resistance variable memory cell 106 includes a three-terminal select device, the signal on the word line 102 may be used to select the resistance variable memory cell 106 and a signal through the resistance variable memory cell 106 may be changed by a programming signal applied to the bit line 104.

While the semiconductor devices and structures described herein by way of example may make specific reference to STT-RAM devices, the disclosure is not so limited and may be applied to other semiconductor and memory devices. For example, embodiments of the disclosure may be implemented in PCM RAM devices, RRAM devices, MRAM devices, conductive bridging memory devices, or any semiconductor memory or system that may benefit from improved data state sensing.

Figure 2:
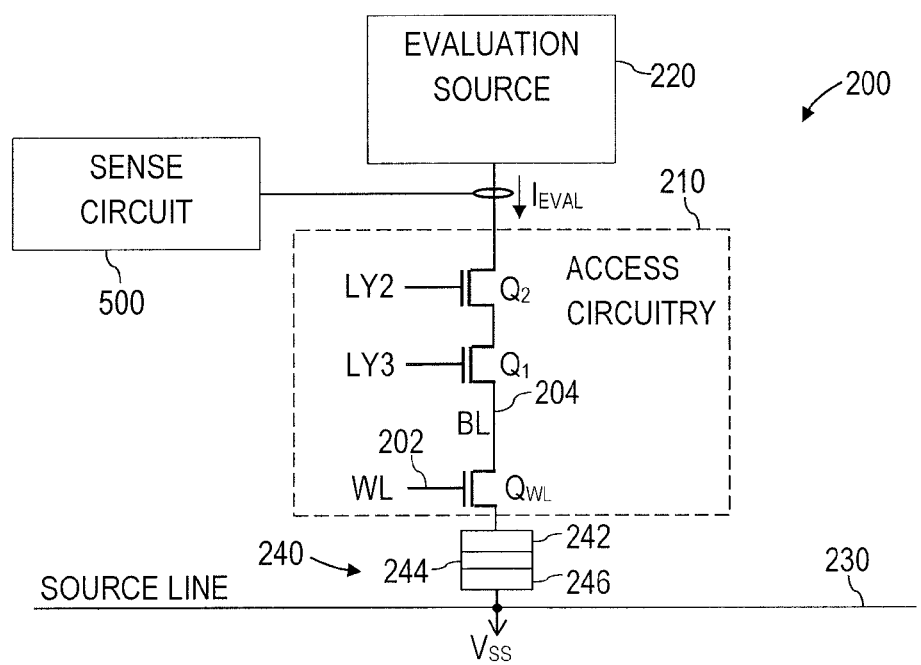
FIG. 2 illustrates a portion of a device including an STT-RAM cell according to embodiments of the present disclosure.

FIG. 2 illustrates a portion 200 of a device including an STT-RAM cell 240 (also referred to herein as "stack 240") according to embodiments of the present disclosure. The STT-RAM cell 240 may be part of an array 100 of resistance variable memory cells 106 in a grid pattern including a number of rows and columns (e.g., FIG. 1), or in various other arrangements depending on the system requirements and fabrication technology. The portion 200 of the device may include a stack 240 and access circuitry 210 configured to selectively operably couple the stack 240 to an evaluation source 220. The evaluation source 220 may be configured to provide an evaluation signal (e.g., an evaluation current $I_{EVAL}$, an evaluation voltage, etc.) to the stack 240 through the access circuitry 210. The portion 200 of the device may also be operably coupled to a sense circuit 500 configured to measure a response (e.g., a voltage response) of the stack 240 to the evaluation signal.

In some embodiments, the access circuitry 210 may include access transistors $Q_{WL}$, $Q_1$, $Q_2$, a bit line 204, a word line 202 operably coupled to a gate of access transistor $Q_{WL}$, a source line 230, and other control lines LY1, LY2 operably coupled to gates of access transistors Q1, Q2, respectively.

The stack 240 may include a magnetic tunnel junction (MTJ), including a nonmagnetic layer 244 between a free layer 242, and a pinned layer 246. The stack 240 may be configured as a metal tunnel junction (MTJ), and may also be referred to herein as an "MTJ storage element" 240.

Generally speaking, when the evaluation source 220 applies the evaluation signal (e.g., $I_{EVAL}$) to the stack 240 through the access circuitry 210, the sense circuit 500 may sense a different response to the evaluation signal depending, at least in part, on a data state of the stack 240. For example, the evaluation signal may be selected to cause the stack 240 to switch from a first data state associated with a first resistance of the stack 240 to a second data state associated with a second resistance of the stack 240. If the sense circuit 500 senses a change in resistance of the stack 240, it may be determined that the stack 240 was in the first data state. If the stack 240 was already in the second data state, the sense circuit 500 may detect no change in resistance of the stack 240.

The STT-RAM cell 240 generally includes a "magnetic cell structure." The magnetic cell structure may be an MTJ if the nonmagnetic layer 244 between the free layer 242 and the pinned layer 244 of the stack 240 is insulative. Alternatively, the magnetic cell structure may be a spin valve if the nonmagnetic layer 244 between the free layer 242 and the pinned layer 246 is conductive. As used in the present description, the term "stack" may refer to a memory cell stack, magnetic cell stack, STT-RAM cell stack, or any component of a memory cell that may include layers and materials in accordance with an embodiment of the present disclosure.

Figure 3A:
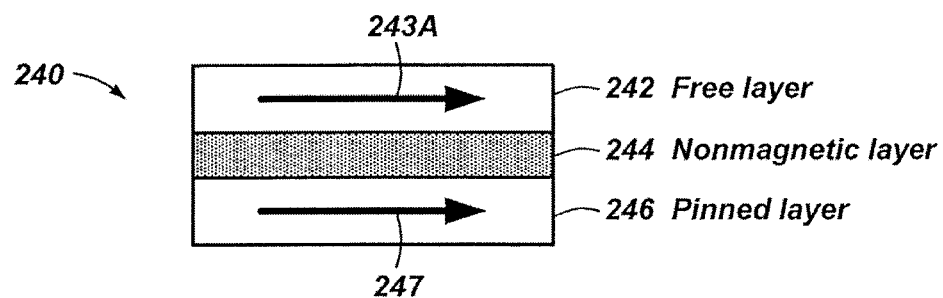
FIGS. 3A and 3B illustrate an example of states of magnetic layers in the STT-RAM cell of FIG. 2.
Figure 3B:
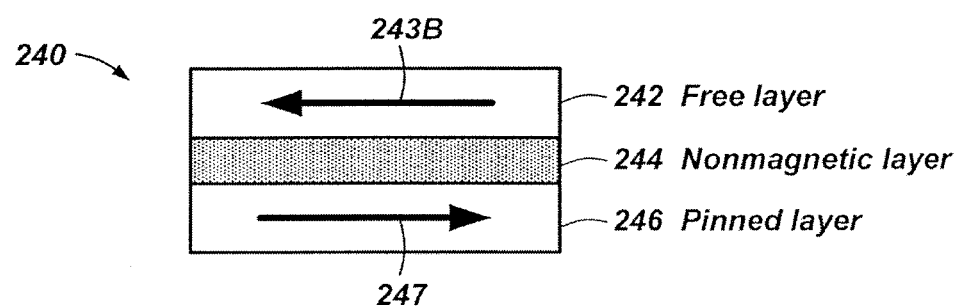

FIGS. 3A and 3B illustrate an example of states of magnetic layers in the STT-RAM cell 240 of FIG. 2. As illustrated in FIGS. 3A and 3B, the MTJ storage element 240 may be formed from two magnetic layers (i.e., the pinned layer 246 and the free layer 242), each of which may hold a magnetic field. The two magnetic layers 242 and 246 may be separated by a nonmagnetic layer 244. The pinned layer 246 may be configured to a particular magnetic polarity 247. A magnetic polarity 243 of the free layer 242, on the other hand, may be configured to change to match that of an external magnetic field that may be applied to the stack 240. A change in the magnetic polarity 243 of the free layer 242 may change the resistance of the MTJ storage element 240. For example, as shown in FIG. 3A, when a magnetic polarity 243A of the free layer 242 matches the magnetic polarity 247 of the pinned layer 246, a relatively low resistance state (i.e., a parallel state) may exist for the stack 240. For example, the resistance of the stack 240 in the parallel state may be R. In contrast, as shown in FIG. 3B, when a magnetic polarity 243B of the free layer 242 is not aligned with the magnetic polarity 247 of the pinned layer 246, a relatively high resistance state (i.e., an anti-parallel state) may exist for the stack 240. For example, the resistance of the stack 240 in the anti-parallel state may be $R_{AP}$.

The resistance $R_{AP}$ of the stack 240 in the anti-parallel state may be a function of a tunnel magnetoresistance (TMR) of the stack 240, approximated by $R_{AP}=R_P(1+TMR)$. By way of non-limiting example, if the TMR of the stack 240 is 50%, and the resistance $R_P$ of the stack 240 in the parallel state is about 10 kilo-ohms (kΩ), the resistance $R_{AP}$ of the stack 240 in the anti-parallel state may be about 15 kΩ. Also by way of non-limiting example, if the TMR of the stack 240 is 30%, and the resistance $R_P$ of the stack 240 in the parallel state is about 10 kΩ, the resistance $R_{AP}$ of the stack 240 in the anti-parallel state may be about 13 kΩ.

FIGS. 3A and 3B illustrate merely one simple embodiment of an MTJ storage element 240. Other embodiments are also contemplated within the scope of the disclosure. By way of non-limiting example, the stack 240 may include more layers, in some embodiments. Also by way of non-limiting example, the orientation of the pinned layer 246 and the free layer 242 may be reversed, in some embodiments.

Referring to FIGS. 2, 3A, and 3B together, in a sense operation of the STT-RAM cell 240, the access transistors $Q_{WL}$, $Q_1$, and $Q_2$ may be turned on by the word line 202 and the other control signals LY1 and LY2, respectively, and an evaluation signal may be applied to the stack 240 through the bit line 204 and the source line 230. Voltage responses of the stack 240 to the evaluation signal may be used to determine whether the stack 240 was in a relatively low resistance state (e.g., $R_P$) or a relatively high resistance state (e.g., $R_{AP}$).

Figure 4A:
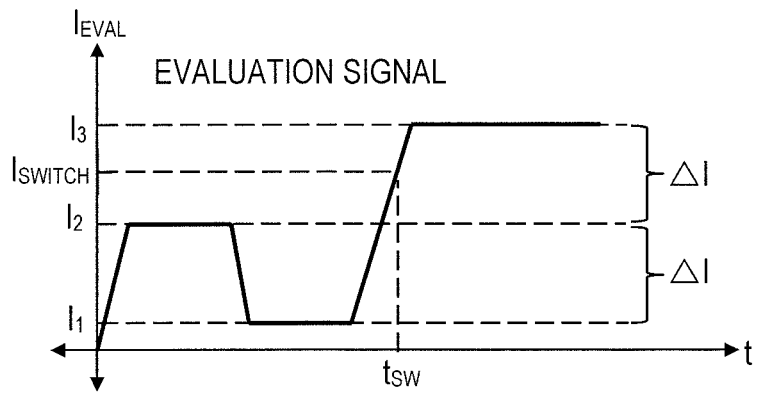
FIG. 4A is a simplified plot of an example evaluation signal that may be applied to the STT-RAM cell of FIG. 2.
Figure 4B:
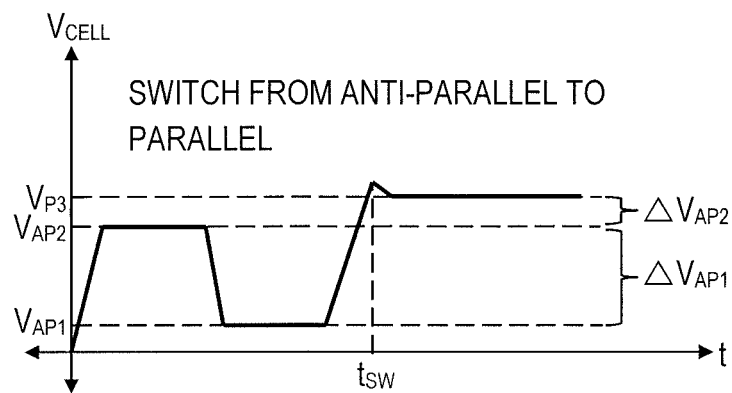
FIG. 4B is a simplified plot of a voltage response of the STT-RAM cell of FIG. 2 to the evaluation signal of FIG. 4A if the STT-RAM cell was in an anti-parallel data state.
Figure 4C:
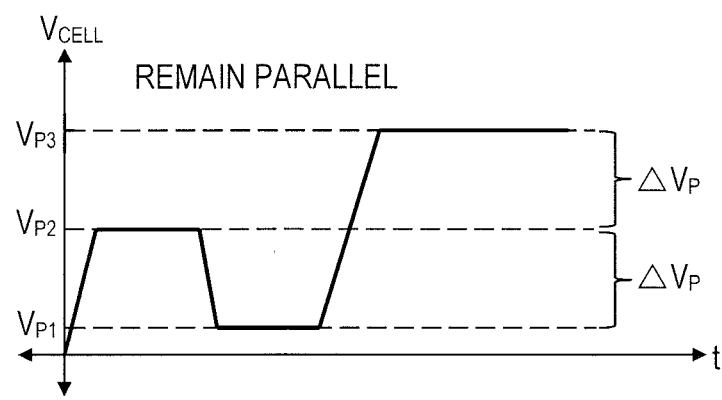
FIG. 4C is a simplified plot of a voltage response of the STT-RAM cell of FIG. 2 to the evaluation signal of FIG. 4A if the STT-RAM cell was in a parallel data state.

FIGS. 4A through 4C are simplified plots of an example evaluation signal 410 (FIG. 4A), response 420, 430 (FIGS. 4B and 4C, respectively) of an STT-RAM cell 240 (FIG. 2) to the evaluation signal 410 if the STT-RAM cell 240 was in an anti-parallel state, and a parallel state, respectively. The evaluation signal 410 (e.g., $I_{EVAL}$) used for the responses of FIGS. 4B and 4C may be configured as a series of three different current values $I_2$, $I_1$, and $I_3$ applied to the STT-RAM cell 240. The three different current values $I_2$, $I_1$, and $I_3$ may be selected so that $I_2$ is about equally spaced between $I_1$ and $I_3$. In other words, $I_2-I_1$ may be approximately equal to $I_3-I_2$ (i.e., $I_2-I_1 \approx I_3-I_2 \approx \Delta I$). As used herein, the phrase "about equally spaced" indicates that the difference $I_2-I_1$ is within ten percent (10%) of the difference $I_3-I_2$. Also, current values $I_2$ and $I_3$ may be selected so that a switching current value $I_{SWITCH}$ configured to switch the STT-RAM cell 240 from a high resistance state to a low resistance state (e.g., from an anti-parallel state to a parallel state) is between current values $I_2$ and $I_3$ (i.e., $I_2<I_{SWITCH}<I_3$). As illustrated in FIG. 4A, the evaluation signal 410 may reach the switching current value $I_{SWITCH}$ at switching time $t_{SW}$.

FIG. 4B illustrates the response of the STT-RAM cell 240 (FIG. 2) to the evaluation signal $I_{EVAL}$ if the STT-RAM cell 240 was in an anti-parallel data state before the evaluation signal $I_{EVAL}$ was applied thereto, and switches to a parallel data state as a result of the applied evaluation signal $I_{EVAL}$. While current values $I_2$ and $I_1$ are applied to the STT-RAM cell 240, the voltage response 420 may be $V_{AP2}$ and $V_{AP1}$, respectively. Since the resistance value of the STT-RAM cell 240 is $R_{AP}$ while current values $I_2$ and $I_1$ are applied thereto, the values of the voltage response $V_{AP2}$ and $V_{AP1}$ may be $V_{AP2}=I_2 \times R_{AP}$ and $V_{AP1}=I_1 \times R_{AP}$, respectively (where _x_ is the multiplication operator). A difference between the values of the voltage response $V_{AP2}$ and $V_{AP1}$ may be $\Delta V_{AP1}$ (i.e., $V_{AP2}-V_{AP1}=\Delta V_{AP1}$).

At switching time $t_{SW}$, however, the resistance of the STT-RAM cell 240 may switch to $R_P$, which is less than $R_{AP}$. As a result, when current value $I_3$ is applied to the STT-RAM cell 240, the voltage response may be $V_{P3}=I_3 \times R_P$. A difference between the values of the voltage response $V_{P3}$ and $V_{AP2}$ may be $\Delta V_{AP2}=V_{P3}-V_{AP2}$. As $R_P$ is less than $R_{AP}$, $\Delta V_{AP2}$ is less than $\Delta V_{AP1}$.

FIG. 4C illustrates the voltage response 430 of the STT-RAM cell 240 (FIG. 2) if the STT-RAM cell 240 was in a parallel data state before the evaluation signal $I_{EVAL}$ was applied thereto. While current values $I_2$, $I_1$, and $I_3$ are applied to the STT-RAM cell 240, the voltage response 430 may be $V_{P2}$, $V_{P1}$, and $V_{P3}$, respectively. Since the resistance value of the STT-RAM cell 240 is $R_P$ while current values $I_2$, $I_1$, and $I_3$ are applied thereto, the values of the voltage response $V_{P2}$, $V_{P1}$, and $V_{P3}$ may be $V_{P2}=I_2 \times R_P$, $V_{P1}=I_1 \times R_P$, and $V_{P3}=I_3 \times R_P$, respectively. A difference between the values of the voltage response $V_{P2}$ and $V_{P1}$ may be $\Delta V_P$ (i.e., $V_{P2}-V_{P1}=\Delta V_{P1}$). A difference between the values of the voltage response $V_{P3}$ and $V_{P2}$ may also be $\Delta V_P$ (i.e., $V_{P3}-V_{P2}=\Delta V_P$), since the resistance of the STT-RAM cell 240 remains substantially constant at $R_P$ as the evaluation signal $I_{EVAL}$ is applied thereto.

Thus, it may be determined whether the STT-RAM cell 240 was in an anti-parallel state or a parallel state by measuring the response 420, 430 of the applied evaluation signal $I_{EVAL}$, and determining if the difference between the response 420, 430 to the current values $I_2$ and $I_1$ is different from the difference between the response 420, 430 to the current values $I_3$ and $I_2$. If the differences are about the same, the STT-RAM cell 240 was in the parallel state. If the differences are different, the STT-RAM cell 240 was in the anti-parallel state.

It should be noted that the description of FIGS. 4A through 4C illustrate an evaluation current $I_{EVAL}$ configured to switch the STT-RAM cell 240 from an anti-parallel state to a parallel state, and the corresponding responses 420, 430. In some embodiments, however, the opposite approach may also be used (i.e., an evaluation current that switches the STT-RAM cell 240 from a parallel to an anti-parallel state may be used).

Figure 5A:
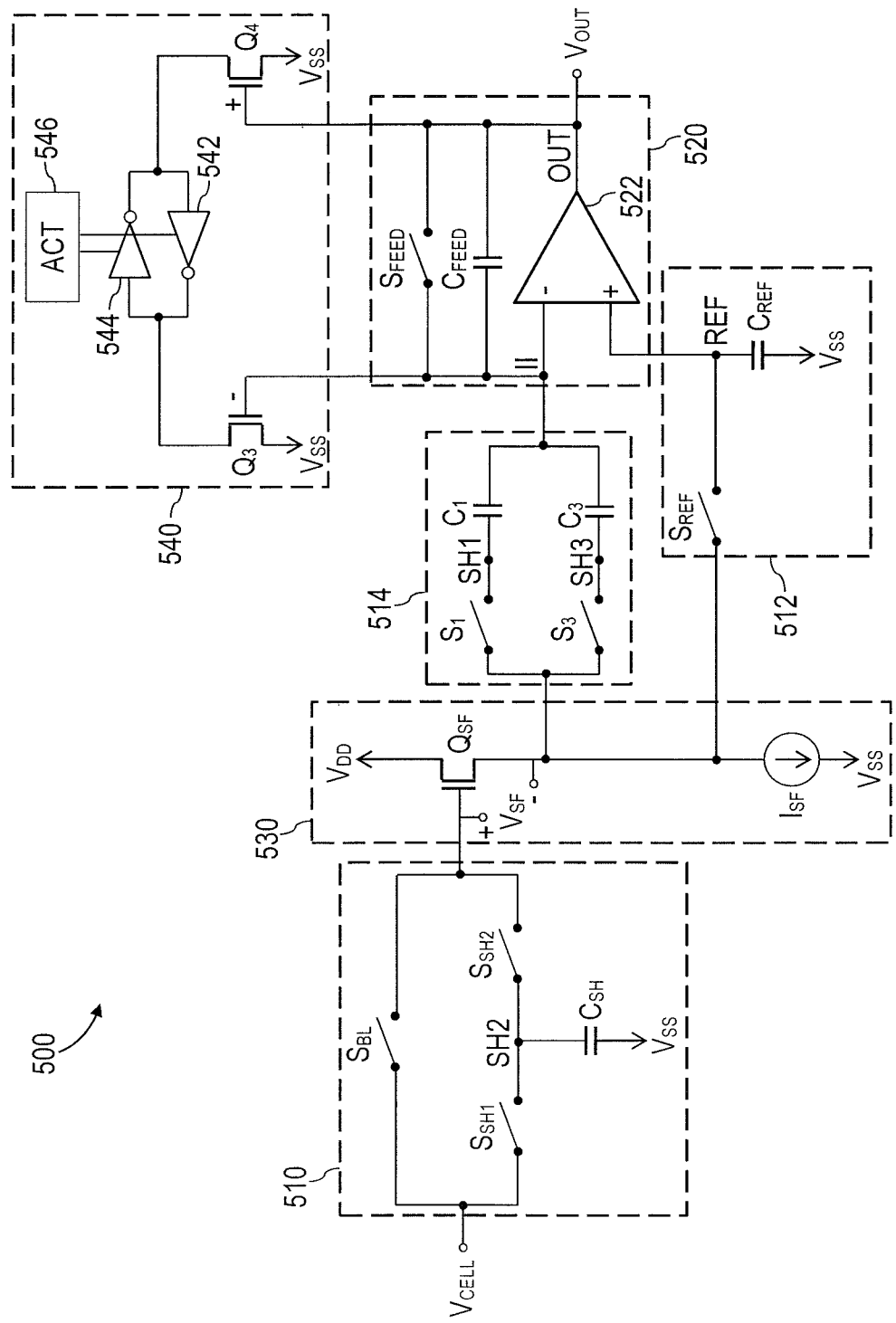
FIG. 5A is a simplified circuit schematic illustration of a sense circuit of FIG. 2.

FIG. 5A is a simplified circuit schematic illustration of the sense circuit 500 of FIG. 2. The sense circuit 500 may include sample and hold circuitry 510, 512, 514 configured to sample and hold response voltage potentials corresponding to the voltage responses $V_{CELL}$ 420, 430 of a data sense line (e.g., the bit line 204 of FIG. 2) operably coupled to a selected STT-RAM cell 240 (FIG. 2) responsive to an evaluation signal $I_{EVAL}$ (FIGS. 2 and 4A) being applied to the selected STT-RAM cell 240. For example, the sample and hold circuitry 510, 512, 514 may be configured to sample and hold a first response voltage potential corresponding to a first voltage potential $V_1$, a second response voltage potential corresponding to a second voltage potential $V_2$, and a third response voltage potential corresponding to a third voltage potential $V_3$. The first voltage potential $V_1$, the second voltage potential $V_2$, and the third voltage potential $V_3$ may be measured voltage responses of the STT-RAM cell 240 to the current levels $I_1$, $I_2$, and $I_3$ of the evaluation current $I_{EVAL}$. For example, if the STT-RAM cell 240 was in an anti-parallel state, the first voltage potential $V_1$, the second voltage potential $V_2$, and the third voltage potential $V_3$ may be $V_{AP1}$, $V_{AP2}$, and $V_{P3}$, respectively. Also, if the STT-RAM cell 240 was in a parallel state, the first voltage potential $V_1$, the second voltage potential $V_2$, and the third voltage potential $V_3$ may be $V_{P1}$, $V_{P2}$, and $V_{P3}$, respectively.

In some instances, the terms "first response voltage potential," "second response voltage potential," and "third response voltage potential" may be used herein to refer to the first voltage potential $V_1$, the second voltage potential $V_2$, and the third voltage potential $V_3$, respectively (e.g., if a buffer 530 is not operably coupled between the sample and hold circuitry 514, 512 sampling and holding the respective "response voltage potential" and the data sense line). In some instances, however, the terms "first response voltage potential," "second response voltage potential," and "third response voltage potential" may refer to buffered versions of the first voltage potential $V_1$, the second voltage potential $V_2$, and the third voltage potential $V_3$, respectively (e.g., if the buffer 530 is operably coupled between the sample and hold circuitry 514, 512 sampling and holding the respective "response voltage potential" and the data sense line). The inclusion or exclusion of the buffer 530 is a design choice, and embodiments of the disclosure encompass embodiments including the buffer 530, and embodiments excluding the buffer 530.

The sense circuit 500 may also include a switched capacitor inverting amplifier 520 including an operational amplifier 522 configured to amplify a difference between a sum of the first voltage potential $V_1$ and the third voltage potential $V_3$, and twice the second voltage potential $V_2$ (i.e., $V_1+V_3-2V_2$, which is sometimes referred to herein as "the amplified difference"). In some instances herein, the switched capacitor inverting amplifier 520 may be described, for simplicity, as being configured to amplify, or as amplifying, a difference between a sum of a first response voltage potential and a third response voltage potential, and twice a second response voltage potential. In these instances, it should be understood that, when configured as discussed herein, the switched capacitor inverting amplifier 520 actually amplifies a quantity substantially equal to the difference between the sum of the first voltage potential $V_1$ and the third voltage potential $V_3$, and twice the second voltage potential $V_2$ (the amplified difference), even if the first, second, and third response voltage potentials are buffered versions of the first voltage potential $V_1$, the second voltage potential $V_2$, and the third voltage potential $V_3$. This is because offsets from the buffer 530 may cancel when the switched capacitor inverting amplifier 520 is configured as discussed below. Thus, regardless of whether or not a buffer 530 is included, the switched capacitor inverting amplifier 520 may be configured to provide the amplified difference.

If the STT-RAM cell 240 was in a parallel state, the amplified difference ($V_1+V_3-2V_2$) may be about zero volts (0 V). If, however, the STT-RAM cell 240 was in an anti-parallel state, the amplified difference may be proportional to about $\Delta V_{AP2}-\Delta V_{AP1}$ (see FIG. 4B), which may be a negative value (because $\Delta V_{AP1}$ is greater than $\Delta V_{AP2}$).

Thus, in some embodiments, a sense circuit includes sample and hold circuitry operably coupled to a data sense line and configured to sample and hold a second response voltage potential, a first response voltage potential, and a third response voltage potential responsive to an evaluation signal being applied to a resistance variable memory cell. The evaluation signal includes a second signal corresponding to the second response voltage potential, a first signal corresponding to the first response voltage potential, and a third signal corresponding to the third response voltage potential. The third signal causes the resistance variable memory cell to transition from a first data state to a second data state. The sense circuit also includes a switched capacitor amplifier operably coupled to the sample and hold circuitry and configured to amplify a difference between a sum of the first response voltage potential and the third response voltage potential, and twice the second response voltage potential.

The switched capacitor inverting amplifier 520 may also include a feedback capacitor $C_{FEED}$ and a feedback switch $S_{FEED}$ operably coupled in parallel with each other from an inverting input (i.e., node II) of the operational amplifier 522 to an output (i.e., node OUT) of the operational amplifier 522. The feedback switch $S_{FEED}$ may be selectively opened and closed. When closed, the feedback switch $S_{FEED}$ may short out the feedback capacitor $C_{FEED}$, essentially transforming the switched capacitor inverting amplifier 520 into a unity gain buffer amplifier. When the feedback switch $S_{FEED}$ is opened, feedback capacitor $C_{FEED}$ may provide capacitive feedback for the switched capacitor inverting amplifier 520.

As previously discussed, the sense circuit 500 may also include a buffer 530, in some instances. The buffer 530 may include a source follower configured to buffer the bit line 204 (FIG. 2) to the sample and hold circuitry 512, 514. The buffer 530 may include a source follower transistor $Q_{SF}$ having a gate, a source, and a drain. The source of the source follower transistor $Q_{SF}$ (e.g., an n-type metal oxide semiconductor field effect transistor (MOSFET)) may be operably coupled to a current source $I_{SF}$. The drain of the source follower transistor $Q_{SF}$ may be operably coupled to a high voltage potential power supply $V_{DD}$. It should be understood that the source follower may instead include a p-type MOSFET having its drain operably coupled to a low voltage potential power supply $V_{SS}$, and its source operably coupled to a current source. The gate of the source follower transistor $Q_{SF}$ may be an input of the buffer 530. Also, the drain of the source follower transistor $Q_{SF}$ may be an output of the buffer 530. Those of ordinary skill in the art should appreciate that a voltage potential on the output of a source follower is the same as a voltage potential on the input, less a source follower voltage drop $V_{SF}$, which may be approximated by $V_{SF}=\text{sqrt}(2I_{SF}/(\mu_n C_{OX} W/L))+V_{TH}$, where $\mu_n$ is the electron mobility, $C_{OX}$ is the oxide capacitance, W/L is the width to length ratio of the source follower transistor $Q_{SF}$, and $V_{TH}$ is the MOS threshold voltage potential of the source follower transistor $Q_{SF}$. It should be understood that other buffer circuits (e.g., a unity gain amplifier buffer) may be used instead of a source follower.

The input of the buffer 530 may be selectively operably coupled to the bit line 204 through sample and hold circuitry 510. Also, the output of the buffer 530 may be selectively operably coupled to the inverting input of the operational amplifier 522 through sample and hold circuitry 514, and to a non-inverting input of the operational amplifier 522 through sample and hold circuitry 512.

In some embodiments, the sense circuit 500 may further include latch circuitry 540 operably coupled between the inverting input of the operational amplifier 522 and the output of the operational amplifier 522. The latch circuitry 540 may be configured to differentially sense the inverting input of the operational amplifier 522 and the output of the operation amplifier 522. The latch circuitry 540 may include cross-coupled inverting elements (e.g., inverters 542, 544). The latch circuitry 540 may also include a latch transistor $Q_3$ having a gate operably coupled to the inverting input of the operational amplifier 522, a source operably coupled to a low voltage potential power supply $V_{SS}$, and a drain operably coupled to an input of inverter 544 and an output of inverter 542. The latch circuitry 540 may further include a latch transistor Q4 having a gate operably coupled to the output of the operational amplifier 522, a source operably coupled to the low voltage potential power supply $V_{SS}$, and a drain operably coupled to an input of inverter 542 and an output of inverter 544. The inverters 542, 544 may be clocked by ACT 546.

The sample and hold circuitry 510 may be configured to selectively operably couple the bit line 204 (FIG. 2) to the input of the buffer 530, and sample and hold the second voltage potential $V_2$. The sample and hold circuitry 510 may include a bit line switch $S_{BL}$ configured to selectively operably couple the bit line 204 (FIG. 2) to the input of the buffer 530. The sample and hold circuitry 510 may also include a series pair of sample and hold switches $S_{SH1}$, $S_{SH2}$ operably coupled in parallel to the bit line switch $S_{BL}$. The sample and hold circuitry 510 may further include a sample and hold capacitor $C_{SH}$ operably coupled from the low voltage potential power supply $V_{SS}$ to between the sample and hold switches $S_{SH1}$, $S_{SH2}$. The sample and hold switch $S_{SH1}$ and the sample and hold capacitor $C_{SH}$ may be configured to sample and hold the second voltage potential $V_2$ to node SH2.

The sample and hold circuitry 512 may be configured to selectively operably couple the output of the buffer 530 to the non-inverting input of the operational amplifier 522, and sample and hold a buffered version of the second voltage potential $V_2$ (i.e., $V_2-V_{SF}$). The sample and hold circuitry 512 may include a reference capacitor $C_{REF}$ operably coupled between the non-inverting input of the operational amplifier 522 and the low voltage potential power supply $V_{SS}$. The sample and hold circuitry 512 may also include a reference switch $S_{REF}$ configured to selectively operably couple the output of the buffer 530 to the non-inverting input of the operational amplifier 522 and the reference capacitor $C_{REF}$. The reference switch $S_{REF}$ and the reference capacitor $C_{REF}$ may be configured to sample and hold a the buffered version of the second voltage potential $V_2$ to a node REF operably coupled to the non-inverting input of the operational amplifier 522.

The sample and hold circuitry 514 may be configured to selectively capacitively couple the output of the buffer 530 to the inverting input of the operational amplifier 522, and sample and hold buffered versions of the first voltage potential $V_1$ and the third voltage potential $V_3$ (i.e., $V_1-V_{SF}$, and $V_3-V_{SF}$, respectively). The sample and hold circuitry 514 may include a first capacitor $C_1$ operably coupled to the inverting input of the operational amplifier 522, and a first switch $S_1$ configured to selectively operably couple the first capacitor $C_1$ between the output of the buffer 530 and the inverting input of the operational amplifier 522. The first switch $S_i$ and the first capacitor $C_1$ may be configured to sample and hold the buffered version of the first voltage potential $V_1$ (i.e., $V_1-V_{SF}$) on node SH1. The sample and hold circuitry 514 may also include a third capacitor $C_3$ operably coupled to the inverting input of the operational amplifier 522, and a third switch $S_3$ configured to selectively operably couple the third capacitor $C_3$ between the output of the buffer 530 and the inverting input of the operational amplifier 522. The third switch $S_3$ and the third capacitor $C_3$ may be configured to sample and hold the buffered version of the third voltage potential $V_3$ (i.e., $V_3-V_{SF}$) on node SH3.

Thus, in some embodiments, a sense circuit includes a buffer including an input configured to selectively operably couple to a selected resistance variable memory cell through a data sense line switch. The sense circuit also includes a switched capacitor amplifier including an operational amplifier including a non-inverting input operably coupled to a low-voltage potential power supply through a reference capacitor, and to an output of the buffer through a reference switch. The switched capacitor amplifier may also include an inverting input operably coupled to a first capacitor and a third capacitor, and an output operably coupled to the inverting input through a feedback capacitor in parallel with a feedback switch. The sense circuit also includes a first switch configured to selectively operably couple the first capacitor to the output of the buffer. The sense circuit further includes a third switch configured to selectively operably couple the third capacitor to the output of the buffer.

Figure 5B:
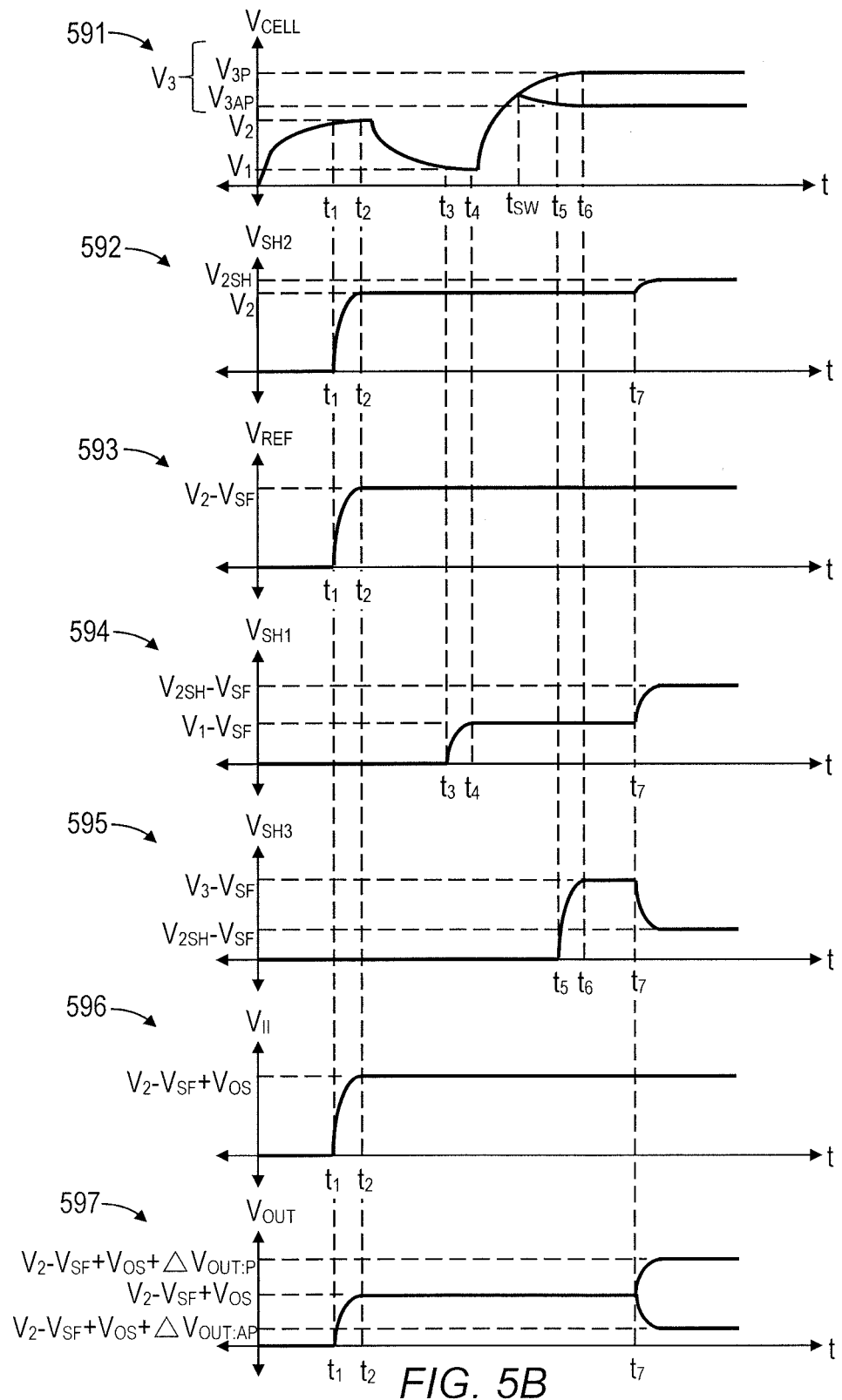
FIG. 5B illustrates simplified plots of various voltage potentials of an example embodiment of the sense circuit of FIG. 5A.

FIG. 5B illustrates simplified plots 591, 592, 593, 594, 595, 596, and 597 of various voltage potentials $V_{CELL}$, $V_{SH2}$, $V_{REF}$, $V_{SH1}$, $V_{SH3}$ $V_{II}$, and $V_{OUT}$, respectively, of an example embodiment of the sense circuit 500 of FIG. 5A.

Referring to FIGS. 5A and 5B together, the evaluation current $I_{EVAL}$ (FIGS. 2 and 4A) may be applied to the STT-RAM cell 240 (FIG. 2). Plot 591 illustrates a response $V_{CELL}$ of the STT-RAM cell 240 (FIG. 2) to the evaluation current $I_{EVAL}$. As may be observed in the plot 591, the voltage response $V_{CELL}$ may be about $V_2$ between times $t_1$ and $t_2$, about $V_1$ between times $t_3$ and $t_4$. Plot 591 also illustrates that between times $t_5$ and $t_6$, the voltage response $V_{CELL}$ may be about $V_3$. Plot 591 further illustrates that at time $t_{SW}$, the voltage response $V_{CELL}$ may begin decreasing toward a $V_3$ of about $V_{3AP}$ if the STT-RAM cell 240 switches from the anti-parallel state to the parallel state (i.e., the STT-RAM cell 240 was in the anti-parallel state before the evaluation signal $I_{EVAL}$ was applied thereto) at time $t_{SW}$. In contrast, at time $t_{SW}$, the voltage response $V_{CELL}$ may continue increasing toward a $V_3$ of $V_{3P}$ if the STT-RAM cell 240 remains in the parallel state (i.e., the STT-RAM cell 240 was in the parallel state before the evaluation signal $I_{EVAL}$ was applied thereto).

It should be understood that the values of $V_1$ and $V_2$ would be $V_{AP1}$ and $V_{AP2}$ (FIG. 4B), respectively, if the STT-RAM cell 240 was in the anti-parallel state, and $V_{P1}$ and $V_{P2}$ (FIG. 4C), respectively, if the STT-RAM cell 240 was in the parallel state. It should also be understood that the value of $V_3$ would be $V_{P3}$, regardless of the state that the STT-RAM cell 240 was in. Although the values of $V_3$ ($V_{3P}$ and $V_{3AP}$) are illustrated as different in the plot 591, the difference would be with reference to $V_1$ and $V_2$. Accordingly, plot 591 shows relative voltage potentials (e.g., normalized voltage potentials), not absolute voltage potentials.

Detailed operation of the sense circuit 500 and time evolution of several of its internal nodes (plots 592 through 597 in FIG. 5B) will now be discussed with reference to FIGS. 5C through 5F. FIGS. 5C through 5F are equivalent circuits 550, 560, 570, and 580, respectively, of the sense circuit 500 of FIG. 5A with switches $S_{SH1}$, $S_{SH2}$, $S_{BL}$, $S_1$, $S_3$, $S_{REF}$, $S_{FEED}$ opened and closed in different configurations. Between about times $t_1$ and $t_2$, switches $S_{SH1}$, $S_{SH2}$, $S_{REF}$, and $S_{FEED}$ may be closed.

Figure 5C:
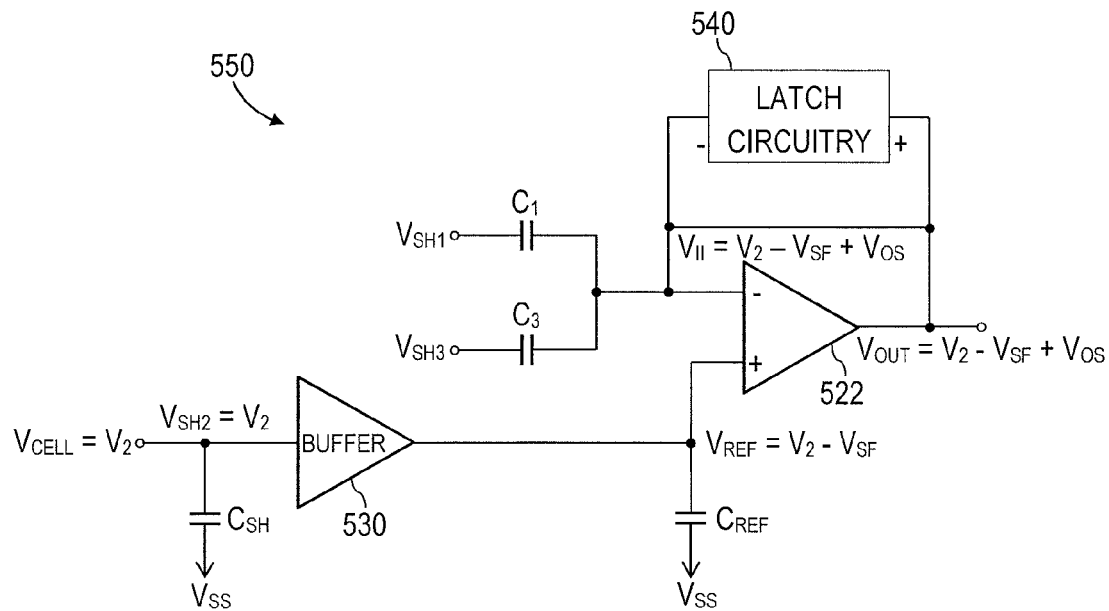
FIGS. 5C through 5F are equivalent circuits of the sense circuit of FIG. 5A with various different switches of the sense circuit opened and closed in different configurations.

FIG. 5C illustrates an equivalent circuit 550 of the sense circuit 500 of FIG. 5A with the switches $S_{SH1}$, $S_{SH2}$, $S_{REF}$, and $S_{FEED}$ of the sense circuit 500 closed between times $t_1$ and $t_2$. Referring to FIGS. 5A, 5B, and 5C together, the voltage response $V_{CELL}$ may be about $V_2$ between $t_1$ and $t_2$ (plot 591). The sample and hold capacitor $C_{SH}$ may be operably coupled to $V_{CELL}$. As a result, $V_{SH2}$ may charge to about $V_2$ between $t_1$ and $t_2$ (plot 592).

The input of the buffer 530 may also be operably coupled to $V_{CELL}$ between $t_1$ and $t_2$. As a result, the buffer 530 may output a buffered version of the second voltage potential $V_2$ (i.e., $V_2-V_{SF}$) between $t_1$ and $t_2$. The reference capacitor $C_{REF}$ and the non-inverting input of the operational amplifier 522 may be operably coupled to the output of the buffer 530. As a result, $V_{REF}$ may charge to about $V_2-V_{SF}$ between $t_1$ and $t_2$ (plot 593).

The inverting input of the operational amplifier 522 may be shorted to the output of the operational amplifier 522 between $t_1$ and $t_2$. As a result, the operational amplifier 522 may function as a unity gain buffer. As the non-inverting input is charged to $V_{REF}=V_2-V_{SF}$ during this time, $V_{OUT}$ and $V_{II}$ may also charge to about $V_2-V_{SF}+V_{OS}$ between $t_1$ and $t_2$ (plots 596 and 597), where $V_{OS}$ is an offset voltage potential of the operational amplifier 522.

At about time $t_2$, switches $S_{SH1}$, $S_{SH2}$, and $S_{REF}$ may be opened ($S_{FEED}$ may remain closed). Between about times $t_3$ and $t_4$, switches $S_{BL}$ and $S_1$ may be closed ($S_{FEED}$ may remain closed between $t_3$ and $t_4$).

Figure 5D:
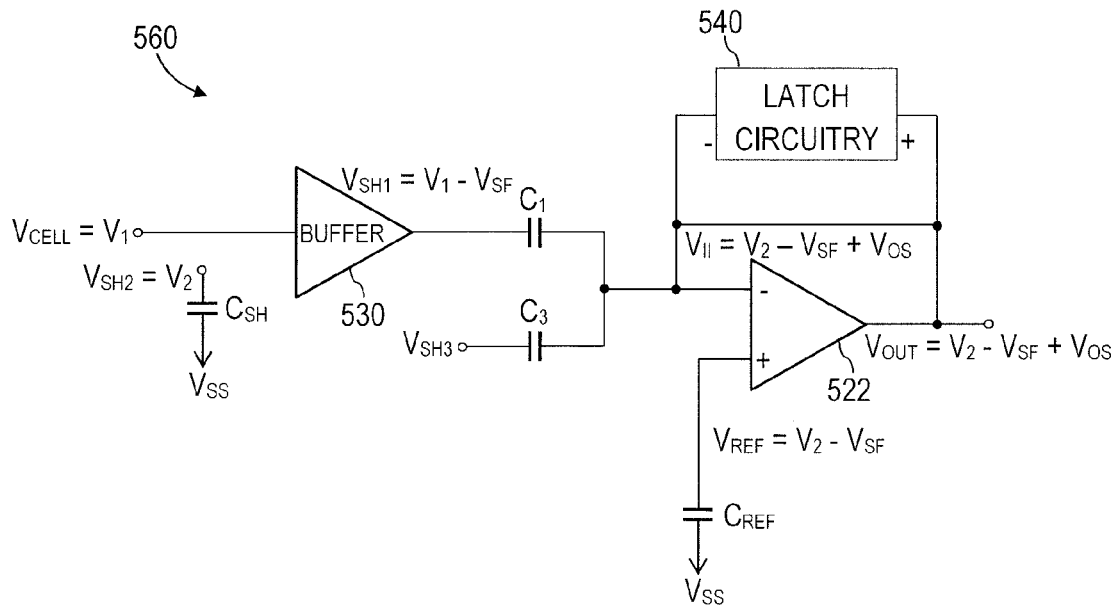

FIG. 5D illustrates an equivalent circuit 560 of the sense circuit 500 of FIG. 5A with the switches $S_{BL}$, $S_1$, and $S_{FEED}$ of the sense circuit 500 closed between times $t_3$ and $t_4$. Referring to FIGS. 5A, 5B, and 5D together, the voltage response $V_{CELL}$ may be about $V_1$ between $t_3$ and $t_4$ (plot 591). The input of the buffer 530 may be operably coupled to $V_{CELL}$. As a result, the output of the buffer 530 may be about $V_1-V_{SF}$ between $t_3$ and $t_4$. Capacitor $C_1$ may be operably coupled to the output of the buffer 530 between $t_3$ and $t_4$. As a result, $V_{SH1}$ may charge to about $V_1-V_{SF}$ between $t_3$ and $t_4$ (plot 594).

The value of $V_{SH2}$ may remain about $V_2$ between $t_3$ and $t_4$ (plot 592), as the capacitor $C_{SH}$ may be decoupled from a discharge path during this time. Similarly, the value of $V_{REF}$ may remain about $V_2-V_{SF}$ between $t_3$ and $t_4$ (plot 593), as the capacitor $C_{REF}$ may also be decoupled from a discharge path during this time. As the operational amplifier 522 continues to operate in the unity-gain buffer configuration during this time, the values of $V_{II}$ and $V_{OUT}$ may remain at about $V_2-V_{SF}+V_{OS}$ between $t_3$ and $t_4$ (plots 596 and 597).

At about time $t_4$, switch $S_1$ may open (switches $S_{BL}$ and $S_{FEED}$ may remain closed). Between about times $t_5$ and $t_6$, switch $S_3$ may be closed ($S_{BL}$ and $S_{FEED}$ may remain closed between $t_5$ and $t_6$).

Figure 5E:
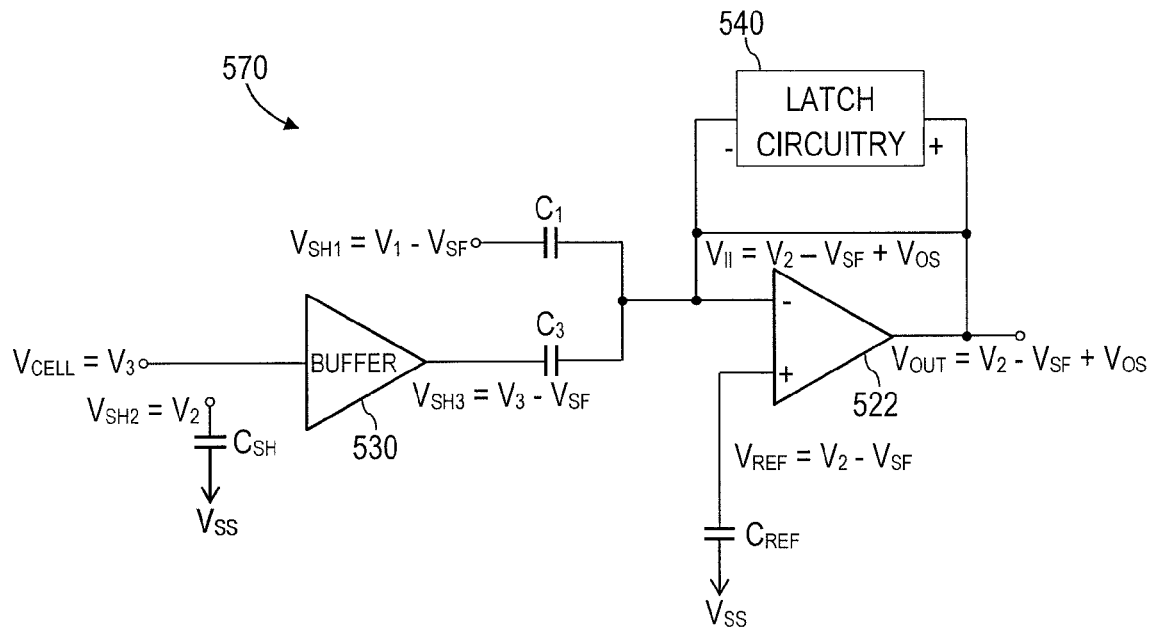

FIG. 5E illustrates an equivalent circuit 570 of the sense circuit 500 of FIG. 5A with the switches $S_{BL}$, $S_3$, and $S_{FEED}$ of the sense circuit 500 closed between times $t_5$ and $t_6$. Referring to FIGS. 5A, 5B, and 5E together, the voltage response $V_{CELL}$ may be about $V_3$ between $t_5$ and $t_6$ (plot 591). Also, the input of the buffer 530 may be operably coupled to $V_{CELL}$ during this time. As a result, the output of the buffer 530 may be about $V_3-V_{SF}$ between $t_5$ and $t_6$. Capacitor $C_3$ may be operably coupled to the output of the buffer 530 between $t_5$ and $t_6$. As a result, $V_{SH3}$ may charge to about $V_3-V_{SF}$ between $t_5$ and $t_6$ (plot 595).

The value of $V_{SH2}$ may remain about $V_2$ between $t_5$ and $t_6$ (plot 592), as the capacitor $C_{SH}$ may remain decoupled from a discharge path during this time. Similarly, the value of $V_{REF}$ may remain about $V_2-V_{SF}$ between $t_5$ and $t_6$ (plot 593), as the capacitor $C_{REF}$ may also be decoupled from a discharge path during this time. As the operational amplifier 522 also continues to operate in the unity-gain buffer configuration during this time, the values of $V_{II}$ and $V_{OUT}$ may remain at about $V_2-V_{SF}+V_{OS}$ between $t_5$ and $t_6$ (plots 596 and 597).

At about time $t_6$, switches $S_{BL}$, and $S_3$ may be opened ($S_{FEED}$ may remain closed). At about time $t_7$, switches $S_{SH2}$, $S_1$, and $S_3$ may be closed, and switch $S_{FEED}$ may be opened.

Figure 5F:
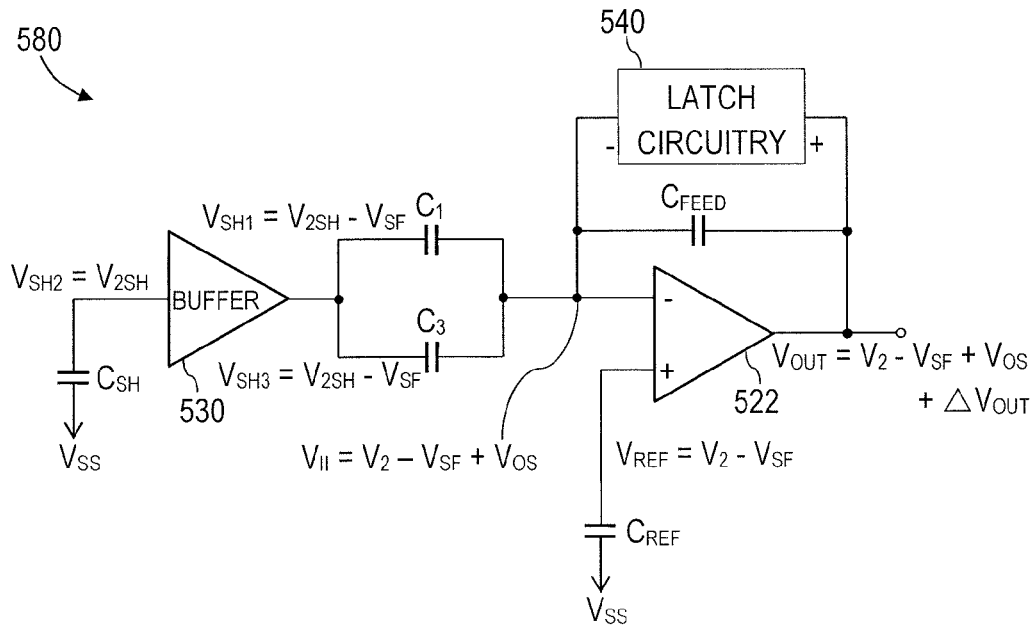

FIG. 5F illustrates an equivalent circuit 580 of the sense circuit 500 of FIG. 5A after the switches $S_{SH2}$, $S_1$, and $S_3$ of the sense circuit 500 were closed at about $t_7$. Referring to FIGS. 5A, 5B, and 5F together, the input of the buffer 530 may be operably coupled to node SH2 at about time $t_7$. As a result, the value of $V_{SH2}$ may charge slightly to $V_{2SH}$ (plot 592), and the output of the buffer 530 may be about $V_{2SH}-V_{SF}$ after $t_7$. Capacitors $C_1$ and $C_3$ may be operably coupled to the output of the buffer 530 after $t_7$. As a result, $V_{SH3}$ and $V_{SH1}$ may charge to about $V_{2SH}-V_{SF}$ after $t_7$ (plots 594 and 595).

The value of $V_{REF}$ may remain about $V_2-V_{SF}$ after $t_7$ (plot 593), as the capacitor $C_{REF}$ may remain decoupled from a discharge path during this time. As a result, the operational amplifier 522 may continue to hold $V_{II}$ to $V_2-V_{SF}+V_{OS}$ after $t_7$ (plot 596). The operational amplifier 522 may, however, no longer operate in a unity-gain buffer configuration, as feedback capacitor $C_{FEED}$ may now be operably coupled between the output and the inverting input of the operational amplifier 522. Rather, as capacitors $C_1$ and $C_3$ discharge responsive to voltage changes across capacitors $C_1$ and $C_3$ as $V_{SH1}$ and $V_{SH2}$ charge to $V_{2SH}$–$V_{SF}$ after time $t_7$ (plots 594 and 595), the discharged charge from $C_1$ and $C_3$ may charge the feedback capacitor $C_{FEED}$. As a result, the output $V_{OUT}$ may change as $\Delta V_{OUT} = \Delta Q_{FEED}/C_{FEED}$, where $\Delta V_{OUT}$ is the change in $V_{OUT}$, and $\Delta Q_{FEED}$ is the change in charge of capacitor $C_{FEED}$ after time $t_7$. Thus, $V_{OUT}$ may charge to $V_{OUT} = V_2 - V_{SF} + V_{OS} + \Delta V_{OUT}$ after time $t_7$ (plot 597).

The latch circuitry 540 may differentially sense the difference between the inverting input of the operational amplifier 522 and the output of the operational amplifier 522 (i.e., $V_{OUT} - V_{II} = [V_2 - V_{SF} + V_{OS}] + \Delta V_{OUT} - [V_2 - V_{SF} + V_{OS}] = \Delta V_{OUT}$). As a result, the latch circuitry 540 may essentially be configured to sense $\Delta V_{OUT}$ (as $V_2$, $V_{SF}$, and $V_{OS}$ terms all cancel each other out).

Generally speaking, $\Delta V_{OUT}$ may be expressed as:

$$\Delta V_{OUT} = \frac{C_1}{C_{FEED}}(V_1 + V_3 - 2V_{2SH}) + \frac{C_3 - C_1}{C_{FEED}}(V_3 - V_{2SH}).$$

As apparent in this expression, parasitic offsets (e.g., $V_{SF}$ from the buffer 530, and $V_{OS}$ from the operational amplifier 522) do not affect the value of $\Delta V_{OUT}$, which is the differential voltage sensed by the latch circuitry 540. Accordingly, $\Delta V_{OUT}$ may be independent of these parasitic offsets.

In some embodiments, $C_3$ and $C_1$ may be selected to be about the same (e.g., $C_3 = C_1$). In such embodiments, $\Delta V_{OUT}$ may reduce to about:

$$\Delta V_{OUT} = \frac{C_1}{C_{FEED}}(V_1 + V_3 - 2V_{2SH}).$$

Accordingly, the switched capacitance inverting amplifier 520 may be configured to amplify the quantity $V_1 + V_3 - 2V_{2SH}$ (the amplified difference) by a factor $(C_1/C_{FEED})$. In some embodiments, the value of $C_{FEED}$ may be selected to be less than $C_1$ to increase the gain of the amplified difference. By way of non-limiting examples, the values of $C_1$ and $C_{FEED}$ may be selected such that the quantity $C_1/C_{FEED}$ is about 2, 4, 6, 10, 15, 20, 100, and any other value.

If the selected STT-RAM cell 240 (FIG. 2) was in the parallel state, the value of $\Delta V_{OUT}$ may be about zero volts (0 V). If, on the other hand, the selected STT-RAM cell 240 was in the anti-parallel state, the value of $\Delta V_{OUT}$ may be about:

$$\Delta V_{OUT} = \frac{C_1}{C_{FEED}}(\Delta V_{AP2} - \Delta V_{AP1}),$$

where $\Delta V_{AP2}$ and $\Delta V_{AP1}$ may be $V_{P3} - V_{AP2}$, and $V_{AP2} - V_{AP1}$, respectively (FIG. 4B). As $\Delta V_{AP2}$ is less than $\Delta V_{AP1}$, $\Delta V_{OUT}$ may be a negative value if the selected STT-RAM cell 240 was in the anti-parallel state. Accordingly, it may be possible to determine what operational state the STT-RAM cell 240 was in by applying the evaluation signal $I_{EVAL}$ thereto, and monitoring $\Delta V_{OUT}$ (e.g., with the latch circuitry 540). For example, if $V_{OUT}$ does not change after time $t_7$, it may be determined that the selected STT-RAM cell 240 was in the parallel state. If, however, $V_{OUT}$ decreases after time $t_7$, it may be determined that the selected STT-RAM cell 240 was in the anti-parallel state. Of course, applying the evaluation signal $I_{EVAL}$ to the selected STT-RAM cell 240 may result in the selected STT-RAM cell 240 switching from the anti-parallel state to the parallel state, if the selected STT-RAM cell 240 was in the anti-parallel state. Accordingly, a programming signal may be applied to the selected STT-RAM cell 240 after the sense operation to switch the selected STT-RAM cell 240 back to the anti-parallel state, if it is desired for the STT-RAM cell 240 to remain in the anti-parallel state.

Thus, in embodiments where $C_1$ and $C_3$ are about the same, after time $t_7$, the value of $V_{OUT}$ may stay about the same if the selected STT-RAM cell 240 was in the parallel state, and decrease if the selected STT-RAM cell 240 was in the anti-parallel state. It may be preferable, however, in some instances, for the output $V_{OUT}$ to change (e.g., in opposite directions) both if the selected STT-RAM cell 240 was in parallel state, and if the selected STT-RAM cell 240 was in the anti-parallel state. This may be achieved by selecting $C_3$ and $C_1$ to have different values (i.e., $C_3 \neq C_1$).

In some embodiments, $C_3$ may be selected to be greater than $C_1$. For example, $C_3$ may be selected such that $C_3 = A \cdot C_1$, where $A > 1$. Also, a quantity $B$ may be defined as $B = A - 1$. In such embodiments, $\Delta V_{OUT}$ may be about:

$$\Delta V_{OUT} = \frac{C_1}{C_{FEED}}[V_1 + V_3 - 2V_{2SH} + B(V_3 - V_{2SH})].$$

In such embodiments, not only may the amplified difference $V_1 + V_3 - 2V_{2SH}$ still be amplified by the gain $C_1/C_{FEED}$, similarly as previously discussed regarding the embodiments where $C_1 = C_3$, but another quantity $B(V_3 - V_{2SH})$ may also be amplified by the gain $C_1/C_{FEED}$. If the selected STT-RAM cell 240 was in the parallel state in such embodiments, the value of $\Delta V_{OUT}$ may be about:

$$\Delta V_{OUT:P} = \frac{C_1}{C_{FEED}} B(V_3 - V_{2SH}).$$

As $V_3$ is greater than $V_{2SH}$ (plot 591), $\Delta V_{OUT:P}$ may be a positive value. If, however, the STT-RAM cell 240 was in the anti-parallel state, the value of $\Delta V_{OUT}$ may be about:

$$\Delta V_{OUT:AP} = \frac{C_3}{C_{FEED}} \Delta V_{AP2} - \frac{C_1}{C_{FEED}} \Delta V_{AP1}.$$

This value of $\Delta V_{OUT:AP}$ may be either a positive value or a negative value, depending on the system parameters (e.g., $C_1$, $C_3$, the TMR of the stack 240, the evaluation signal $I_{EVAL}$, etc.). As a result, careful selection of the system parameters may enable a system designer to set a desirable value for $\Delta V_{OUT:AP}$. For example, as $\Delta V_{OUT}$ may be sensed by latch circuitry 540, it may be desirable to select system parameters such that $V_{OUT}$ decreases after time $t_7$ if the selected STT-RAM cell 240 was in the anti-parallel state by about the same amount as $V_{OUT}$ increases after time $t_7$ if the selected STT-RAM cell 240 was in the parallel state (i.e., $\Delta V_{OUT:AP} = -\Delta V_{OUT:P}$). Plot 597 illustrates such behavior after time $t_7$.

By way of non-limiting example, $\Delta V_{OUT:AP} = -\Delta V_{OUT:P}$ may be achieved by selecting $C_3$ to be about:

$$C_3 = \left(\frac{\Delta V_P + \Delta V_{AP1}}{\Delta V_P + \Delta V_{AP2}}\right) C_1,$$

or, equivalently:

$$C_3 = \left(1 + \frac{I_3 TMR}{2\Delta I - I_2 TMR}\right) C_1,$$

where $I_3$ and $I_2$ are components of the evaluation current $I_{EVAL}$, (FIG. 4A), $\Delta I = I_3 - I_2$, and TMR is the tunnel magnetoresistance of the STT-RAM cell 240. Accordingly, in such embodiments, $\Delta V_{OUT:AP} = -\Delta V_{OUT:P}$ may be achieved by selecting B (i.e., B=A-1, where $C_3 = A\ C_1$) to be about:

$$B = \frac{I_3}{\frac{2\Delta I}{TMR} - I_2}.$$

In such embodiments (i.e., where $\Delta V_{OUT:P} = -\Delta V_{OUT:P}$), if the value of $V_{OUT}$ increases after time $t_7$, it may be determined that the selected STT-RAM cell 240 was in the parallel state (plot 597). If, however, the value of $V_{OUT}$ decreases after time $t_7$, it may be determined that the selected STT-RAM cell 240 was in the anti-parallel state. The latch circuitry 540 may clock after time $t_7$, and the latch circuitry 540 may store a positive value if the selected STT-RAM cell 240 was in the parallel state, and a negative value if the selected STT-RAM cell 240 was in the anti-parallel state.

As previously discussed, applying the evaluation signal $I_{EVAL}$ to the selected STT-RAM cell 240 may result in the selected STT-RAM cell 240 switching from the anti-parallel state to the parallel state, if the selected STT-RAM cell 240 was in the anti-parallel state. Accordingly, a programming signal may be applied to the selected STT-RAM cell 240 after the sense operation to switch the selected STT-RAM cell 240 back to the anti-parallel state, if it is desired that the STT-RAM cell 240 remain in the anti-parallel state.

One advantage of the sense circuit 500 (FIG. 2, 5A) includes independence of the change in output $\Delta V_{OUT}$ from system parasitics (e.g., $V_{OS}$, $V_{SF}$), as the sensing margin is primarily a result of charge flowing from capacitors $C_1$ and $C_3$ to $C_{FEED}$. As a result, the read signal $\Delta V_{OUT}$ may be maximized, and sense operations may be reliable, deterministic and fast (e.g., on the order of about 40 nanoseconds (ns)). Specifically, by sensing differentially the nodes OUT (the output of the operational amplifier 522) and II (the inverting input of the operational amplifier 522), both $V_{SF}$ (the offset of the source follower) and $V_{OS}$ (the offset of the operational amplifier 522) become a common mode, and may not influence the sensing margin and the speed of the sense operation.

Another advantage of the sense circuit 500 may be that the capacitor ratio $C_1/C_{FEED}$ may deterministically set the gain of $\Delta V_{OUT}$. As a result, gains on the order of 15 or 20 may easily be achieved, and time to develop a margin of 500 millivolts (mV) may be less than 5 ns, assuming typical parameters of STT-RAM cells 240. Also, with a 500 mV latch margin, the latch circuitry 540 may not require autozero. Furthermore, power consumption of the operational amplifier 522 may be reduced.

The resulting sense circuit 500 may be efficient, and have latency overhead on the order of about 5 ns after the sample and hold voltage potentials $V_1$, $V_2$, and $V_3$ have been sampled. Also, the sense circuit 500 may be used successfully, even for STT-RAM cells having a TMR value of greater than only about 20% (as opposed to some conventional systems requiring a TMR of greater than about 250%).

Furthermore, the sense circuit 500 may be relatively simple, and require relatively little space to implement. For example, the operational amplifier 522 may be sufficient if it is stable and has an acceptable gain bandwidth product (e.g., a simple folded cascade implementation may suffice). Also, the use of balanced switches may reduce charge injection problems at samplings. Furthermore, the ratio of the capacitors $C_1$, $C_2$, and $C_{FEED}$ determines the gain, not the actual values $C_1$, $C_2$, and $C_{FEED}$ of the capacitors themselves. Accordingly, very small capacitors (taking into account parasitic capacitances) may be used, as long as the ratios produce the desired gain.

Figure 6:
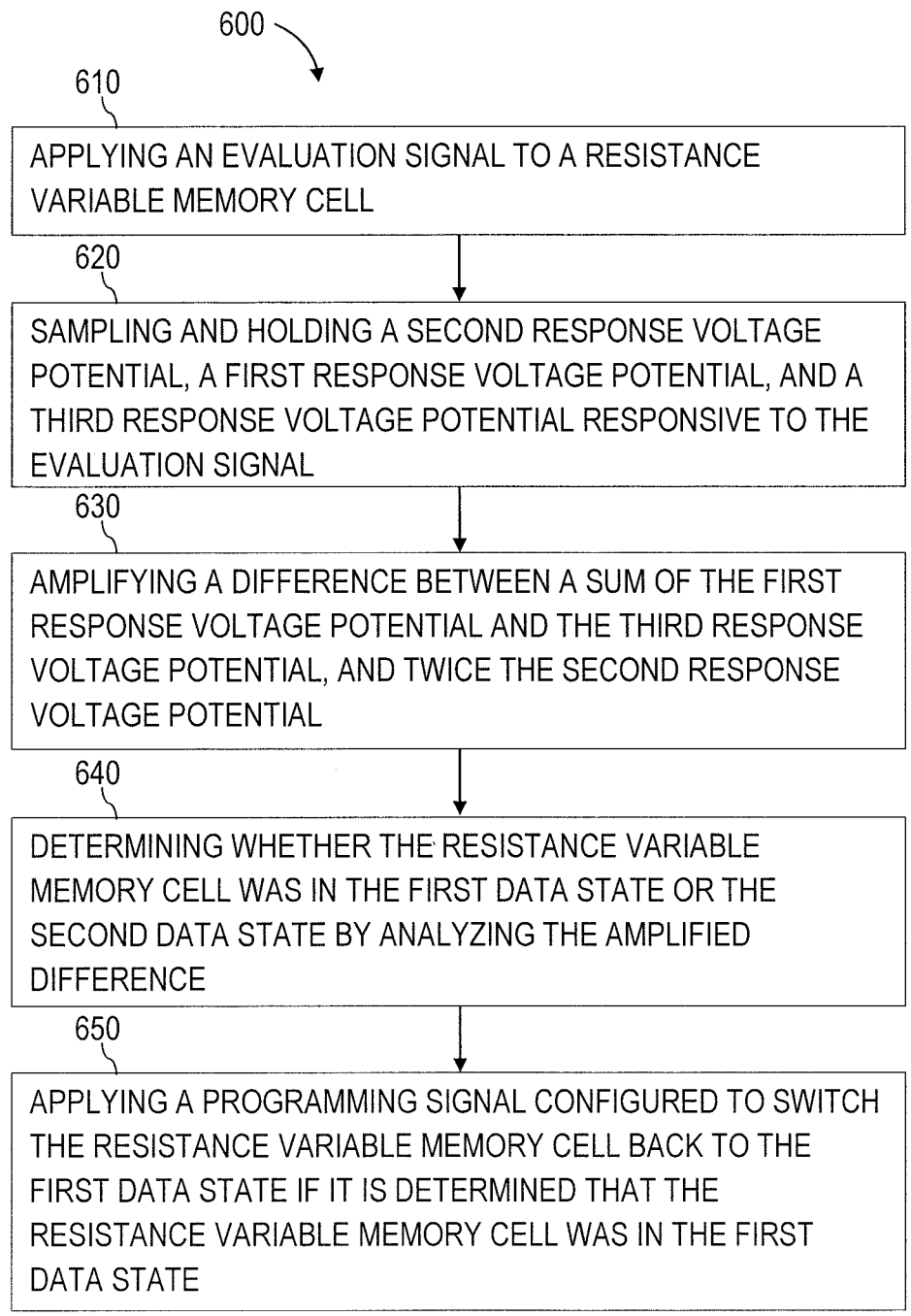
FIG. 6 is a simplified flowchart illustrating a method of sensing a data state of a resistance variable memory cell.

FIG. 6 is a simplified flowchart 600 illustrating a method of sensing a data state of a resistance variable memory cell 106, 240. At operation 610, the method may include applying an evaluation signal $I_{EVAL}$ to the resistance variable memory cell 106 (FIGS. 1, 2, and 4A). In some embodiments, the evaluation signal $I_{EVAL}$ may include a sequential series of a second evaluation current $I_2$, a first evaluation current $I_1$, and a third evaluation current $I_3$. A value of the second evaluation current $I_2$ may be about equally spaced between values of the first evaluation current $I_1$ and the third evaluation current $I_3$. (FIG. 4A). Also, the value of the third evaluation current $I_3$ may be selected to switch the resistance variable memory cell 106, 240 from a first data state to a second data state (FIGS. 1, 2, and 4A).

At operation 620, the method may include sampling and holding a second response voltage potential (e.g., $V_2$), a first response voltage potential (e.g., $V_1$), and a third response voltage potential (e.g., $V_3$) with sample and hold circuitry 510, 512, 514 of a sense circuit 500 (FIGS. 5A and 5B). The second response voltage potential, the first response voltage potential, and the third response voltage potential may be voltage responses of the resistance variable memory cell 106, 240 to the second current $I_2$, the first current $I_1$, and the third current $I_3$, respectively, of the evaluation signal $I_{EVAL}$. In some embodiments, sampling and holding the response voltage potentials may include sampling and holding buffered versions of one or more of the second voltage potential $V_2$, the first voltage potential $V_1$, and the third voltage potential $V_3$.

At operation 630, the method may include amplifying a difference between a sum of the first response voltage potential and the third response voltage potential, and twice the second response voltage potential (e.g., $V_1 + V_3 - 2\ V_2$) with an amplifier. In some embodiments, amplifying the difference may include amplifying the difference with a switched capacitor amplifier. In some embodiments, amplifying the difference may include amplifying the difference with a switched capacitor inverting amplifier 520 (FIG. 5A).

At operation 640, the method may include determining whether the resistance variable memory cell 106, 240 was in the first data state or the second data state by analyzing the amplified difference. In some embodiments, analyzing the amplified difference may include applying the amplified difference to latch circuitry 540 (FIG. 5A). In some embodiments, the first data state may be an anti-parallel state of an STT-RAM cell 240, and the second data state may be a parallel state of the STT-RAM cell 240.

At operation 650, the method may include applying a programming signal configured to switch the resistance variable memory cell 106, 240 back to the first data state if it is determined that the resistance variable memory cell 106, 240 was in the first data state.

Thus, in some embodiments, a method of sensing a data state of a resistance variable memory cell includes applying a second evaluation signal to the resistance variable memory cell. The method also includes sampling and holding a second response voltage potential of the resistance variable memory cell responsive to the second evaluation signal. The method may further include applying a first evaluation signal to the resistance variable memory cell, and sampling and holding a first response voltage potential of the resistance variable memory cell responsive to the first evaluation signal. The method may also include applying a third evaluation signal to the resistance variable memory cell, wherein the third evaluation signal switches the resistance variable memory cell from a first data state to a second data state. The method may further include sampling and holding a third response voltage potential of the resistance variable memory cell responsive to the third evaluation signal. The method may also include amplifying a difference between a sum of the first response voltage potential and the third response voltage potential, and twice the second response voltage potential.

Figure 7:
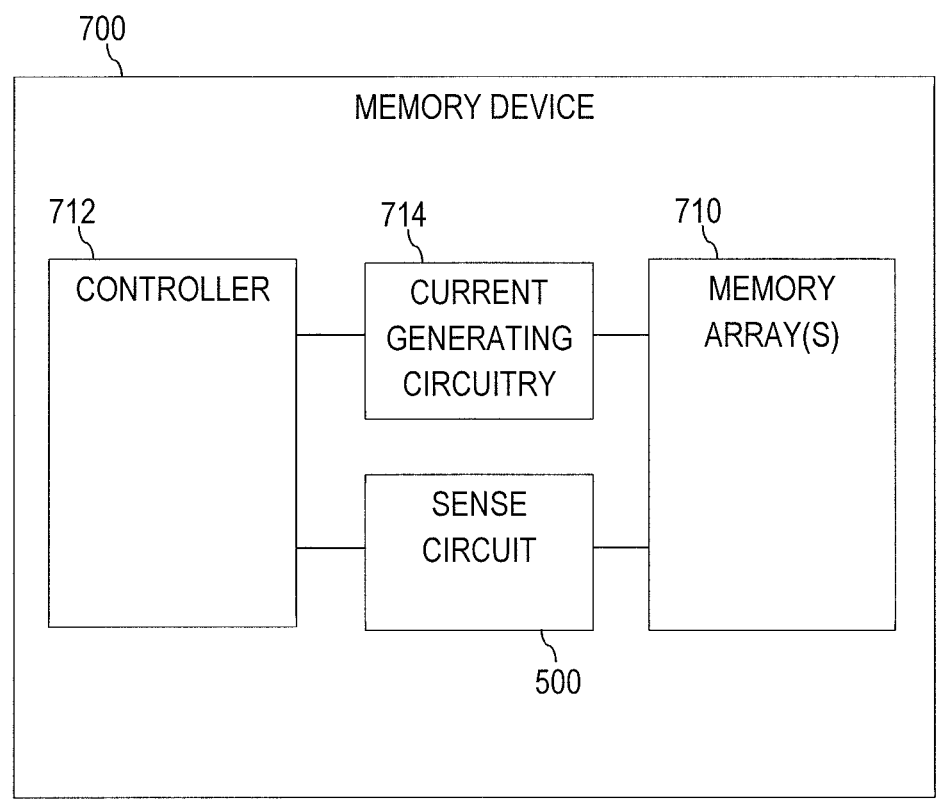
FIG. 7 illustrates a block diagram of an apparatus in the form of a memory device according to embodiments of the present disclosure.

FIG. 7 illustrates a block diagram of an apparatus in the form of a memory device 700 according to embodiments of the present disclosure. As shown in FIG. 7, the memory device 700 may include a controller 712 operably coupled to current generating circuitry 714 and a sense circuit 500. The sense circuit 500 and the current generating circuitry 714 may be operably coupled to a memory array 710 (e.g., through selection circuitry) including an array of resistance variable memory cells 106, 240 (FIGS. 1 and 2).

In some embodiments, the memory array 710 may be analogous to, for example, the memory array 100 previously described in connection with FIG. 1. Although one memory array 710 is shown in FIG. 7, embodiments of the present disclosure are not so limited (e.g., the memory device 700 may include more than one memory array 710 coupled to one or more controllers 712).

The controller 712 may include, for example, control circuitry, firmware, or a combination thereof. The controller 712 may be included on the same physical device (e.g., the same die) as the memory array 710, or may be included on a separate physical device that is communicatively coupled to the physical device that includes the memory array 710. For example, the controller 712 may be a controller of an array testing apparatus (e.g., a controller 712 used to perform testing operations on memory arrays, such as memory array 710).

The current generating circuitry 714 may be configured to provide an evaluation signal (e.g., $I_{EVAL}$) to a selected resistance variable memory cell 106, 240 (FIGS. 1, 2), as discussed above. The sense circuit 500 may be configured to sense a data state of the selected resistance variable memory cell 106, 240 responsive to the evaluation signal, as discussed above.

Embodiments similar to FIG. 7 may include additional circuitry that is not illustrated so as not to obscure embodiments of the present disclosure. For example, the memory device 700 may include address circuitry to latch address signals provided over Input/Output (I/O) connectors through I/O circuitry. Address signals may be received and decoded by a row decoder and a column decoder, to access the memory array 710.

Thus, in some embodiments, a memory device includes an evaluation signal generating circuit, an array of resistance variable memory cells, and sense circuitry. The evaluation signal generating circuit is capable of providing an evaluation signal including a second evaluation signal, a first evaluation signal, and a third evaluation signal. Each resistance variable memory cell of the array is configured to switch from a first data state to a second data state responsive to the third evaluation signal. The sense circuitry is configured to operably couple to a selected resistance variable memory cell of the array and determine a data state of the selected resistance variable memory cell by sampling and holding a second response voltage potential responsive to the second evaluation signal, a first response voltage potential responsive to the first evaluation signal, and a third response voltage potential responsive to the third evaluation signal, and amplifying a difference between a sum of the first response voltage potential and the third response voltage potential, and twice the second response voltage potential.

Those of ordinary skill in the art should appreciate that the resistance variable memory cells 106, 240 of the memory array 710 may be slightly different from each other (e.g., as a result of imperfections in processing techniques that form the resistance variable memory cells 106, 240, process corners, variable thermal distributions on the memory array 710 during use, etc.). As a result, resistance values associated with different data states of the resistance variable memory cells 106, 240 may differ from one resistance variable memory cell 106, 240 to another. Such variations between resistance values of the resistance variable memory cells 106, 240 may not pose a significant problem for the sense circuit 500 because the sense circuit 500 may essentially be configured to self-reference each of the resistance variable memory cells 106, 240 (e.g., sense operations may be performed based on measurements of a selected resistance variable memory cell 106, 240 without the use of a separate reference resistance), in contrast to some conventional sensing systems, some of which may rely on reference resistances (e.g., reference resistors, reference memory cells, etc.) to determine a data state of a selected memory cell. In fact, it may be possible to maintain relatively low error probability (e.g., on the order of $10^{-9}$) even with relatively large variation (e.g., on the order of 10% to 15% standard deviation) between resistance values of the resistance variable memory cells 106, 240 in their various corresponding data states.

Also, as previously discussed, the sense circuit 500 may be configured to measure a change in an output voltage $\Delta V_{OUT}$ that is not a function of system offsets (e.g., $V_{OS}$, $V_{SF}$). Accordingly, different system offsets in different sense circuits 500 (e.g., as a result of complementary metal-oxide-semiconductor (CMOS) mismatch) within the same memory device 700, or in different memory devices 700, also may not pose a problem to the sense circuit 500 (in contrast to some conventional sense systems that may sense signals that, at least in part, are functions of system offsets). Furthermore, the gain of the amplified difference (e.g., $V_{OUT}$, as discussed above) may be a function of ratios of system capacitances alone (e.g., as a result of active charge sharing between $C_1$, $C_3$, and $C_{FEED}$), which may not be affected by variation between resistance variable memory cells 106, 240, and CMOS mismatch.

While certain illustrative embodiments have been described in connection with the figures, those of ordinary skill in the art will recognize and appreciate that embodiments encompassed by the disclosure are not limited to those embodiments explicitly shown and described herein.

Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed by the disclosure.

What is claimed is:

1. A sense circuit, comprising:
sample and hold circuitry operably coupled to a data sense line and configured to sample and hold a first response voltage potential, a second response voltage potential, and a third response voltage potential responsive to respective values of an evaluation signal comprising three different values being applied to a resistance variable memory cell operable in multiple data states, a third value being greater than a second value and the second value being greater than a first value;
circuitry operably coupled to the sample and hold circuitry and configured to determine a data state of the resistance variable memory cell by comparing a difference between the first and second response voltage potentials to a difference between the second and third response potentials.

2. The sense circuit of claim 1, wherein the evaluation signal comprises a current and a second current value is about equally spaced between respective values of a first current value and a third current value.

3. The sense circuit of claim 1, wherein the circuitry configured to determine a data state of the resistance variable memory cell comprises:
a switched capacitor amplifier operably coupled to the sample and hold circuitry and configured to amplify a difference between a sum of the first response voltage potential and the third response voltage potential, and twice the second response voltage potential; and
a latch circuit operably coupled to the switched capacitor amplifier and configured to differentially sense and store a voltage change of an output of the switched capacitor amplifier.

4. The sense circuit of claim 3, wherein the sample and hold circuitry includes a reference capacitor operably coupled to a non-inverting input of an operational amplifier of the switched capacitor amplifier, the reference capacitor configured to sample a buffered version of the second response voltage potential, and hold the non-inverting input to the buffered version of the second response voltage potential.

5. The sense circuit of claim 4, wherein the sample and hold circuitry includes a capacitor operably coupled to an inverting input of an operational amplifier of the switched capacitor amplifier, and configured to sample and hold a buffered version of the first response voltage potential; and
another capacitor operably coupled to the inverting input and configured to sample and hold a buffered version of the third response voltage potential.

6. The sense circuit of claim 5, wherein the other capacitor has a capacitance value larger than a capacitance value of the capacitor.

7. The sense circuit of claim 5, wherein the other capacitor has a capacitance value that is about the same as a capacitance value of the capacitor.

8. The sense circuit of claim 5, wherein the switched capacitor amplifier includes a feedback capacitor and a feedback switch operably coupled in parallel with each other from the inverting input to an output of the switched capacitor amplifier.

9. The sense circuit of claim 8, wherein the capacitor has a capacitance value that is greater than a capacitance value of the feedback capacitor.

10. The sense circuit of claim 8, wherein the capacitor has a capacitance value that is at least about fifteen (15) times as large as a capacitance value of the feedback capacitor.

11. The sense circuit of claim 3, wherein the switched capacitor amplifier is further configured to amplify a difference between the third response voltage potential and the second response voltage potential.

12. The sense circuit of claim 1, further comprising a buffer configured to buffer the data sense line from at least a portion of the sample and hold circuitry.

13. The sense circuit of claim 12, wherein the buffer includes a source follower circuit.

14. A semiconductor device, comprising:
an evaluation signal generating circuit for providing an evaluation signal including three values;
an array of resistance variable memory cells, each resistance variable memory cell of the array configured to switch from a first data state to a second data state responsive to a greatest value of the three values; and
sense circuitry configured to operably couple to a selected resistance variable memory cell of the array and determine a data state of the selected resistance variable memory cell by:
sampling and holding a first response voltage potential responsive to a first value of the evaluation signal, a second response voltage potential responsive to a second value of the evaluation signal, and a third response voltage potential responsive to a third value of the evaluation signal; and
comparing a difference between the first and second response voltage potentials to a difference between the second and third response voltage potentials.

15. The semiconductor device of claim 14, wherein each resistance variable memory cell of the array comprises a spin torque transfer (STT) memory cell.

16. A method, comprising:
applying a signal to a resistance variable memory cell;
sampling and holding first, second and third voltage potentials responsive to the signal;
amplifying a difference between a sum of the first and third voltage potentials and twice the second voltage potential;
analyzing the amplified difference to determine a data state of the resistance variable memory cell; and
applying another signal to switch the resistance variable memory cell to a data state corresponding to a preselected, determined data state.

17. The method of claim 16, wherein sampling and holding the voltage potentials comprises sampling and holding buffered versions of one or more of the voltage potentials.

18. The method of claim 16, wherein amplifying the difference between a sum of the first and third voltage potentials and twice the second voltage potential comprises amplifying the difference with one of a switch capacitor amplifier and a switch capacitor inverting amplifier.

19. The method of claim 16, wherein analyzing the amplified difference comprises applying the amplified difference to latch circuitry.

20. The method of claim 16, wherein applying another signal to switch the resistance variable memory cell to a data state corresponding to a preselected, determined data state comprises applying the other signal to switch the resistance variable memory cell back to a data state existing prior to the application of the signal.

* * * * *

UNITED STATES PATENT AND TRADEMARK OFFICE
CERTIFICATE OF CORRECTION

| | |
|---|---|
| PATENT NO. | : 9,640,239 B2 |
| APPLICATION NO. | : 15/258204 |
| DATED | : May 2, 2017 |
| INVENTOR(S) | : Michele Piccardi and Ferdinando Bedeschi |

Page 1 of 1

It is certified that error appears in the above-identified patent and that said Letters Patent is hereby corrected as shown below:

In the Specification

Column 7, Line 53, change "may be R." to --may be $R_P$.--

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*